United States Patent [19]

Hamamoto et al.

[11] Patent Number: 5,126,968
[45] Date of Patent: Jun. 30, 1992

[54] CONTENT ADDRESSABLE SEMICONDUCTOR MEMORY DEVICE AND OPERATING METHOD THEREFOR

[75] Inventors: Takeshi Hamamoto; Toshifumi Kobayashi; Tadato Yamagata; Masaaki Mihara, all of Hyogo, Japan

[73] Assignee: Mitsubishi Denki Kabushiki Kaisha, Tokyo, Japan

[21] Appl. No.: 605,707

[22] Filed: Oct. 30, 1990

[30] Foreign Application Priority Data

Nov. 16, 1989 [JP] Japan .................................. 1-300526

[51] Int. Cl.$^5$ ............................................. G11C 13/00
[52] U.S. Cl. .................. 365/49; 365/189.01; 365/230.01
[58] Field of Search ...................... 365/189.01, 222, 49, 365/230.01

[56] References Cited

U.S. PATENT DOCUMENTS 3,701,980 10/1972 Mundy .

OTHER PUBLICATIONS

"Content-Addressable Memories" by T. Kohonen, pp. 143 and 257.
"Low-Cost Associative Memory" by Joseph L. Mundy et al, Journal of Solid State Circuits, vol. SC-7, No. 5, pp. 364–368, Oct. 1972.

Primary Examiner—Terrell W. Fears
Attorney, Agent, or Firm—Lowe, Price, LeBlanc & Becker

[57] ABSTRACT

A semiconductor memory device comprises a plurality or CAM cells. In a refreshing operation, data of "1" is applied to all of bit lines and inversion bit lines. In the CAM cells storing the data "1", writing of the data "1" onto the bit lines and the inversion bit lines is performed. Then, the data of "0" is applied to all of the bit lines and the inversion bit lines. In the CAM cells storing the data "0", writing of the data "0" onto the bit lines and the inversion bit lines is performed. In a partial writing operation, in the CAM cells to which writing is performed, a first control node is activated, thereby making it possible to write the CAM cells. In the rest of the CAM cells, the first control node is inactivated, thereby making it impossible to write the CAM cells.

20 Claims, 17 Drawing Sheets

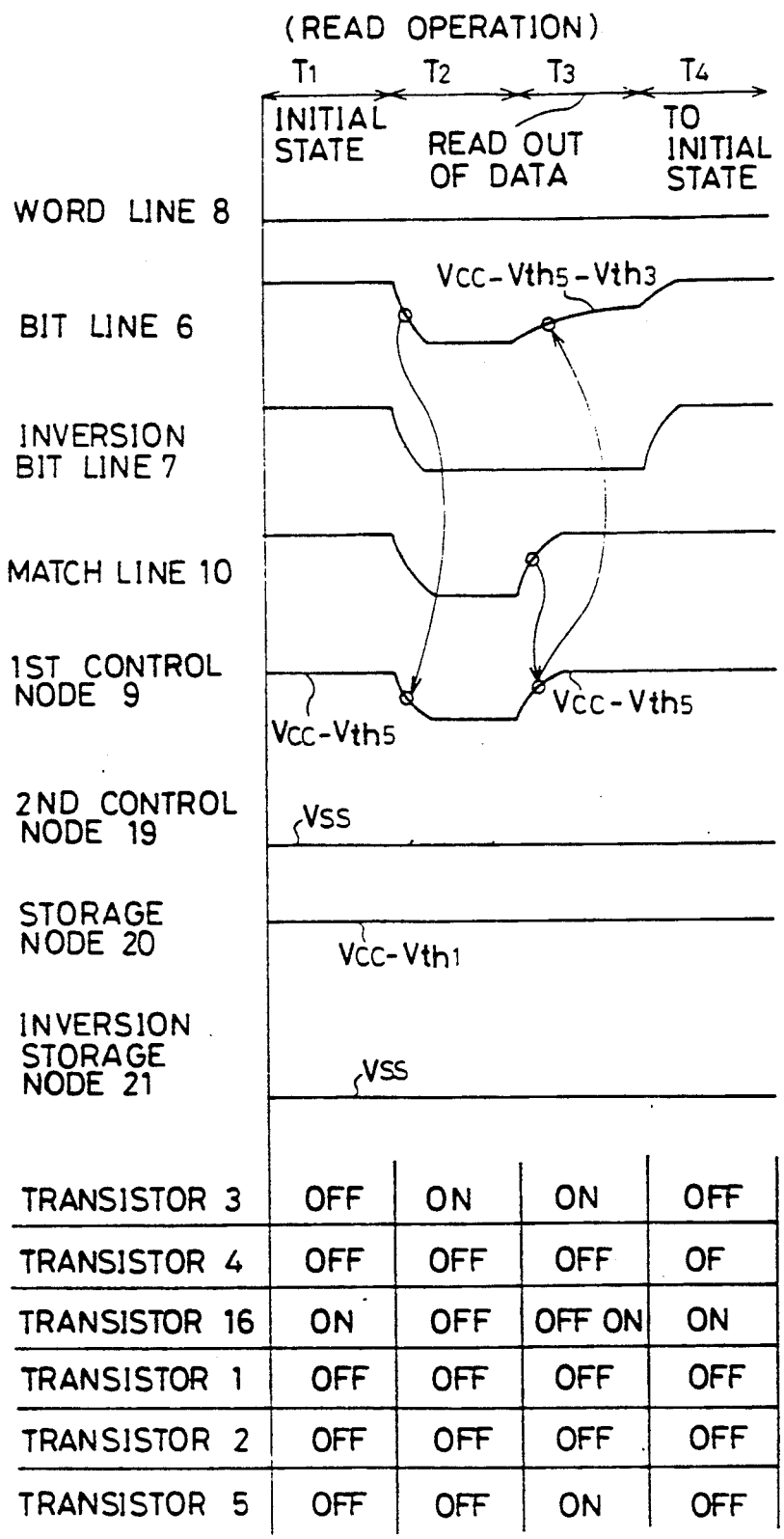

FIG.7B

| CAM OPERATION | 70 | 71 | 72 | 73 | 74 | 75 | 76 |
|---|---|---|---|---|---|---|---|
| READ | ○ (SINGLE) | × | × | × | × | ○ | ○ |
| WRITE | ○ (SINGLE) | ○ | × | × | × | × | × |
| SEARCH | × | ○ | ○ | ○ | ○ | × | × |
| ARRAY BASED REFRESH | ○ (ALL) | ○ | × | × | × | × | ○ |
| PARTIAL WRITE FOR PLURAL WORDS | ○ (PLURAL) | ○ | × | × | × | × | × |

○ : ACTIVATE
× : NOT ACTIVATE (SINGLE) : ACTIVATE A SINGLE WORD
(PLURAL) : ACTIVATE PLURAL WORDS
(ALL) : ACTIVATE ALL WORDS

FIG.7C
(PARTIAL WRITE FOR PLURAL WORDS)
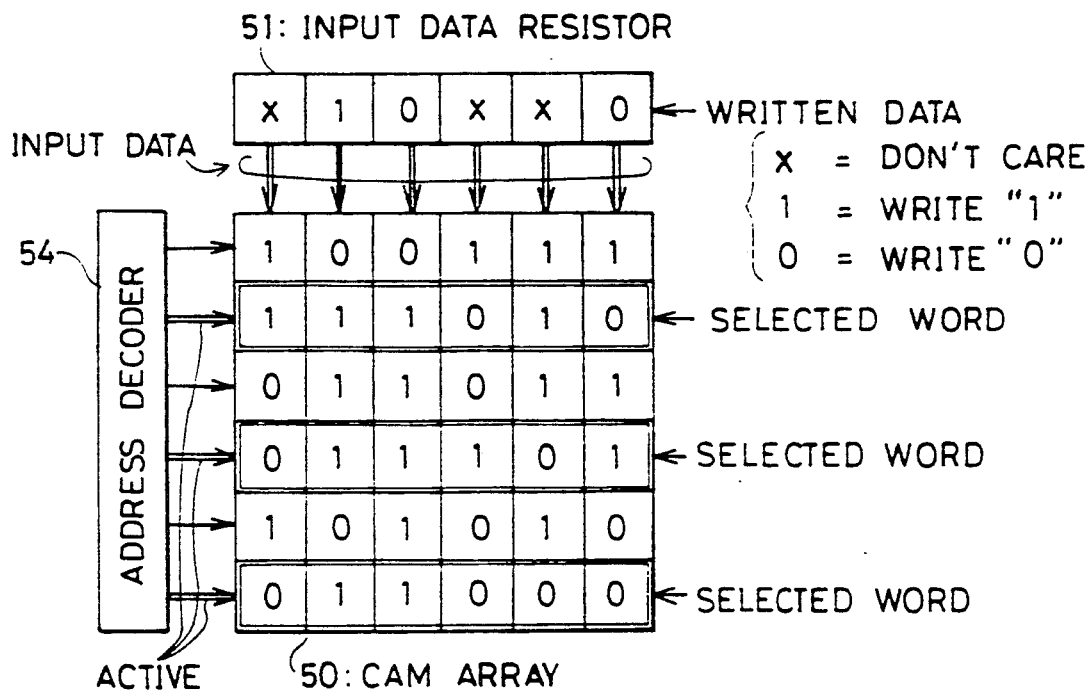
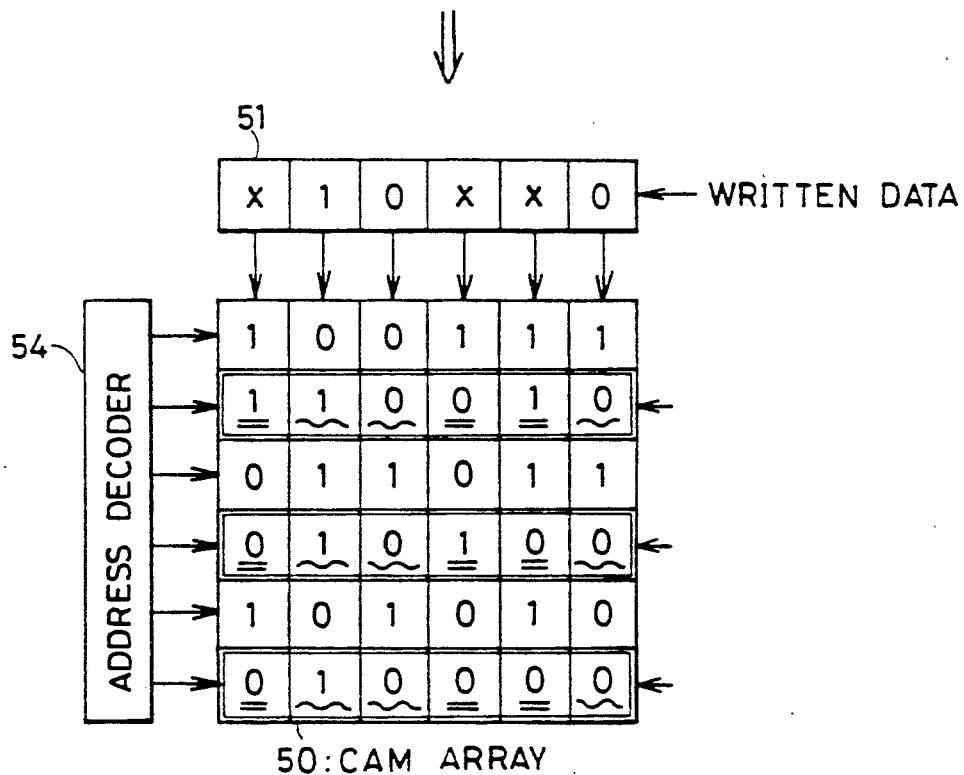

FIG.7D
(MASKED SEARCH)
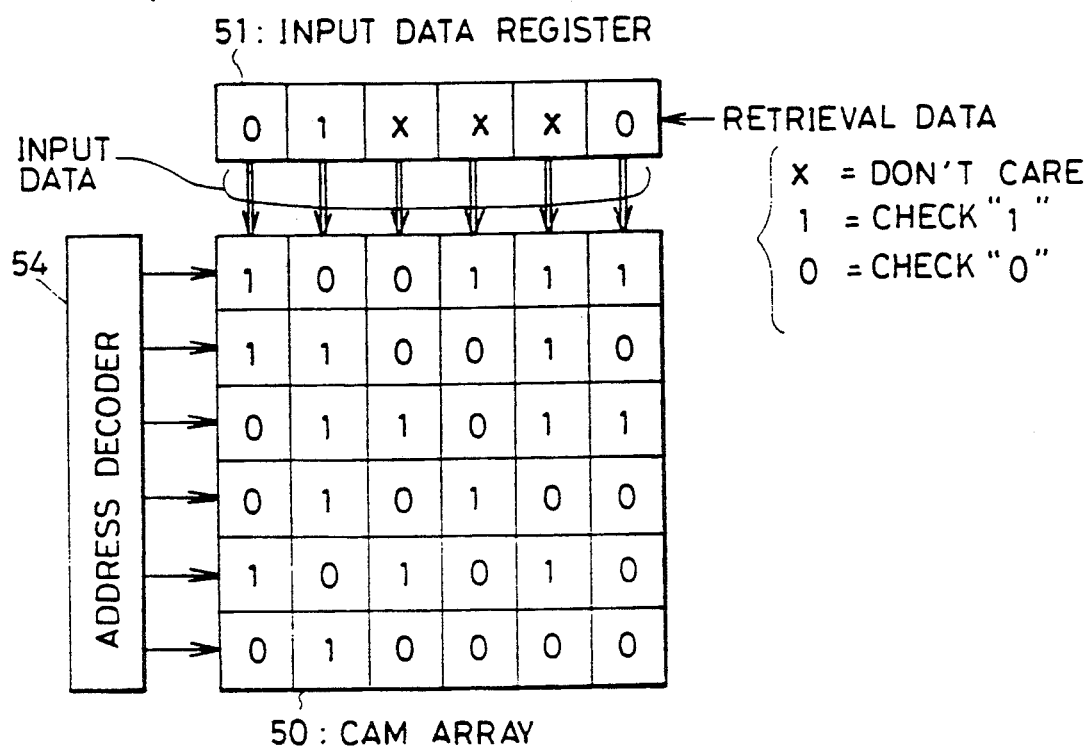
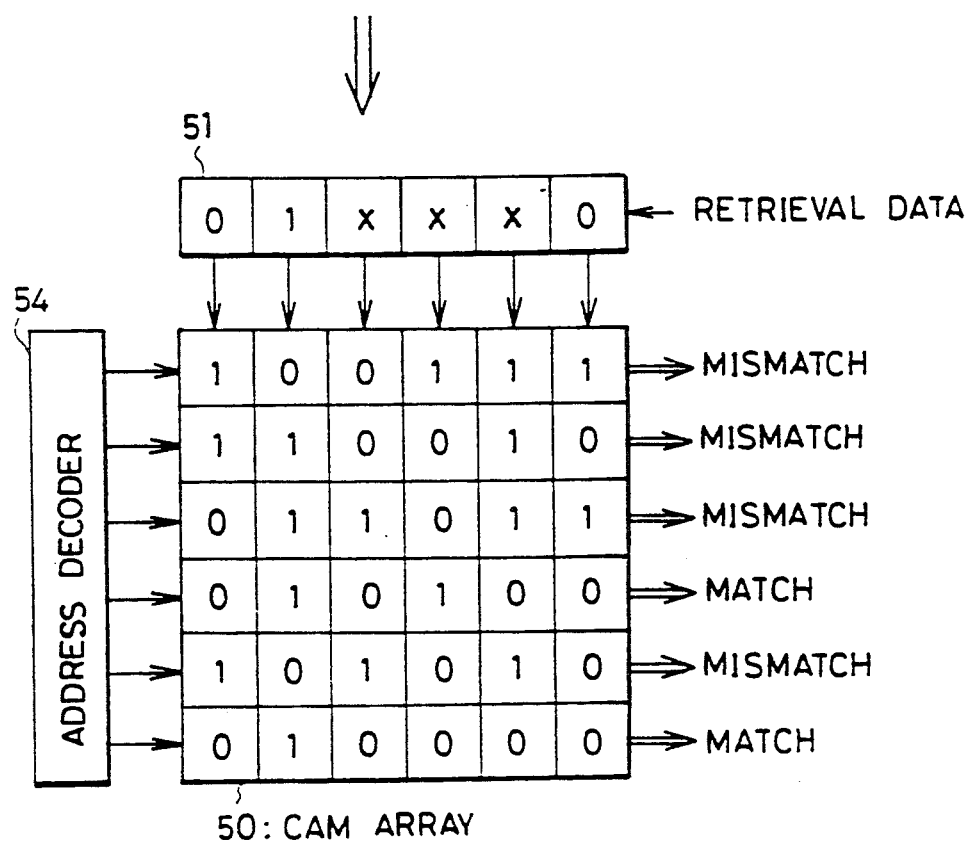

CONTENT ADDRESSABLE SEMICONDUCTOR MEMORY DEVICE AND OPERATING METHOD THEREFOR

CROSS-REFERENCE TO RELATED APPLICATION

The present application is related to copending application Ser. No. 303,884 filed Jan. 30, 1989 now U.S. Pat. No. 4,991,136 commonly assigned with the present invention.

BACKGROUND OF THE INVENTION

1. Field of the Invention

The present invention relates generally to content addressable memory devices, and more particularly, to semiconductor memory devices having a bit matching function and to a method of refreshing and partially writing on array basis in such semiconductor memory devices.

2. Description of the Background Art

FIG. 11 is a block diagram showing an entire structure of a cache system using a conventional CAM (Content Addressable Memory).

In FIG. 11, a main memory 101 and a cache memory 103 are connected to a CPU 106 through a data bus 104 and an address bus 105. A dynamic RAM or a magnetic disc device is used as the main memory 101. Although the magnetic disc device has a relatively long access time, it has a large capacity and is inexpensive. As the cache memory 103, a CAM is used. Although the CAM has a small capacity, it has a short access time. The cache memory 103 is provided to shorten the access time of the main memory 101. Of the data stored in the main memory 101, those which are accessed with high frequency are stored in the cache memory 103 together with the addresses thereof. The writing and the comparing operations of the cache memory 103 are controlled by a memory controller 102.

In a system structured as described above, the cache memory 103 is accessed prior to the access of the main memory 101 by the CPU 106. More specifically, when an address signal is outputted from the CPU 106 to the address bus 105, the cache memory 103 is controlled by the memory controller 102 to check whether the address corresponding to the address signal is stored in the cache memory 103 or not. If the corresponding address is stored in the cache memory 103, a hit signal 103a is outputted from the cache memory 103 and applied to the memory controller 102. When the hit signal 103a is applied from the memory controller 102 to the CPU 106, data is read out from a region corresponding to be region where the address is stored in the cache memory 103. If the address corresponding to the address signal outputted from the CPU 106 is not stored in the cache memory 103, no hit signal 103a is applied and the main memory 101 is accessed.

The above described cache memory 103 comprises a plurality of content addressable memory cells. The CAM cell has, in addition to a general writing and reading function, a matching function for comparing data stored in the memory cell with externally applied retrieval data in order to determine whether they are matching with each other or not.

In the article, "Content-Addressable Memories" by T. Kohonen, p. 143, a complete CAM organization is described, and in the same article, p. 257, an example of a cache memory using a CAM is described.

FIG. 12 is a circuit diagram of a conventional CAM cell disclosed in "IEEE Journal of Solid-State Circuit", Vol. sc-7, pp. 366 and in U.S. Pat. No. 3,701,980.

As shown in FIG. 12, the CAM cell comprises five n channel MOS transistors 1 to 5. The transistor 1 is connected between a bit line 6 and a storage node 20, and the transistor 2 is connected between an inversion bit line 7 and an inversion storage node 21, the gate of each of the transistors 1 and 2 being connected to a word line 8. The transistor 3 is connected between the bit line 6 and a control node 9 and the transistor 4 is connected between the inversion bit line 7 and the control node 9. A gate of the transistor 3 is connected to the storage node 20 and a gate of the transistor 4 is connected to the inversion storage node 21. The transistor 5 is connected between a match line 10 and the control node 9, a gate of which the transistor 5 being connected to the match line 10.

Now, the writing, matching, reading and refreshing operations of the CAM cell of FIG. 12 will be described. In the following description, "H" (logical high) indicates a power supply potential Vcc or a potential approximate thereto, and "L" (logical low) indicates a ground potential Vss or a potential approximate thereto, wherein Vcc>Vss. In addition, data of the bit line pair 6 and 7 being "0" is equivalent to a potential on the bit line 6 being at the "L" level and a potential on the inversion bit line 7 being at the "H" level, and data of the bit line pair 6 and 7 being "1" is equivalent to the potential on the bit line 6 being at the "H" level and the potential on the inversion bit line 7 being at the "L" level.

WRITING OPERATION

In the writing operation, a potential on the word line 8 is brought to the "H" level, the data to be written is applied to the bit line pair 6 and 7, and after a certain period of time, the potential on the word line 8 is brought to the "L" level.

For example, the data to be written is "1", namely the "H" level is applied to the bit line 6 and the "L" line is applied to the inversion bit line 7. In this case, the potential of the "H" leave on the bit line 6 is applied to a gate capacitance of the transistor 3 through the transistor 1 which is turned on receiving a gate input of the "H" level from the word line 8. In the similar manner, the potential of the "L" level on the inversion bit line 7 is applied to a gate capacitance of the transistor 4 through the transistor 2 which is turned on upon receiving of a gate input of the "H" level from the word line 8. After a certain period of time, the transistors 1 and 2 are turned off upon receiving the gate input of the "L" level from the word line 8.

As a result of the above described operations, the gate potential of the transistor 3, that is, the potential of the storage node 20 is maintained at Vcc-Vth and the gate potential of the transistor 4, that is, the potential of the inversion storage node 21 is maintained at Vss, wherein Vth indicates a threshold voltage of the transistor 1 to 5.

MATCHING OPERATION

In the matching operation, after the match line 10 is precharged to the "H" level to enter a floating state, retrieval data is applied to the bit line pair 6 and 7. If the stored data and the retrieval data do not match with each other, the match line 10 is discharged to the "L" level. On the other hand, when the stored data and the retrieval data match with each other, the match line 10 is maintained at the "H" level without being discharged.

For example, assuming that the stored data is "1", namely, the "H" level is stored in the gate capacitance of the transistor 3 and the "L" level is stored in the gate capacitance of the transistor 4. In this occasion, the transistor 3 is turned on and the transistor 4 is turned off. When the "1" is applied as the retrieval data, causing the potential on the bit line 6 to attain the "H" level and the potential on the inversion bit line 7 to attain the "L" level, the potential of the control node 9 attains the "H" level. Therefore, the match line 10 is maintained at the "H" level, without being discharged (match).

Assuming that when the stored data is similarly "1", "0" is applied as the retrieval data, so that the potential on the bit line 6 attains the "L" level and the potential on the inversion bit line 7 attains the "H" level. On this occasion, the transistor 3 is turned on and the transistor 4 is turned off, and thus the potential of the control node 9 attains the "L" level. Therefore, the match line 10 is discharged through a discharging patch comprising the transistors 5 and 3 and the bit line 6 (mismatch).

Similarly, when the stored data is "0", if the retrieval data is "1", then the potential of the control node 9 attains the "L" level. Therefore, the match line 10 is discharged, through a discharging comprising the transistors 5 and 4 and the inversion bit line 7 (mismatch). If the retrieval data is "0", the potential of the control node 9 attains the "H" level. Therefore, the match line 10 is maintained at the "H" level without being discharged (match).

In addition, when the "H" level is applied to both of the bit line 6 and the inversion bit line 7, the potential of the control node 9 attains the "H" level irrespective of the value of the stored data. This state corresponds to a state in which no matching operation is carried out to the bit lines, that is, to a mask state.

As described above, in the matching operation, while the match line 10 is discharged when the stored data does not match the retrieval data, it is maintained at the "H" level without being discharged when both of the data match with each other or they are masked.

READING OPERATION

In the reading operation, the match line 10, the bit line 6 and the inversion bit line 7 are discharged to the "L" level, the bit line 6 and the inversion bit line 7 to enter the floating state, and then the potential on the match line 10 is brought to the "H" level.

For example, it is assumed that the stored data is "1". On this occasion, since the transistor 3 is turned on, when the potential on the match line 10 is brought to the "H" level, the potential on the bit line 6 is raised through the transistors 5 and 3, whereby the stored data "1" is read out.

Conversely, it is assumed that the stored data is "0". On this occasion, since the transistor 4 is turned on when the potential on the match line 10 is brought to the "H" level, the potential on the inversion bit line 7 is raised through the transistors 5 and 4, whereby the stored data "0" is read out.

REFRESHING OPERATION

The above described CAM cell is of a dynamic type wherein the storage data is stored in the gate capacitances of the transistors 3 and 4 as electric charges. Accordingly, the stored data might be destroyed due to a leak of the charges. Therefore, a refreshing operation is required every predetermined time period.

In the refreshing operation, after the above described reading operation, the data read out onto the bit line 6 and the inversion bit line 7 is amplified, which is followed by the above described writing operation.

More specifically, after the match line 10, the bit line 6 and the inversion line 7 are discharged to the "L" level, so that the bit line 6 and the inversion line 7 enter the floating state of the "L" level, the potential on the match line 10 is brought to the "H" level. As a result, the stored data is read out onto the bit line 6 and the inversion line 7. Subsequently, the read out data is amplified. By setting the potential on the word line 8 at the "H" level, the amplified data is written into the gate capacitances of the transistors 3 and 4, so that after a fixed period of time, the potential on the word line is brought to the "L" level.

As shown in FIG. 13, a word is structured by a plurality of CAM cells operating as described above. The word herein is a block comprising a plurality of CAM cells connected to a common word line and a common match line.

FIG. 13 shows a word comprising four CAM cells. In FIG. 13, provided are four bit lines 6a–6d, four inversion bit lines 7a–7d, a word line 8, a match line 10, four CAM cells 11a–11d, a word line driver 12, a match line driver 13 and a match line sense amplifier 14.

All of the above described writing, reading and refreshing operations are carried out on a word basis. While the above described matching operation is carried out simultaneously on a plurality of words or an array basis which will be described later, determination of match or mismatch is made on a word basis. More specifically, in each of he above described operations, drive the word line 8 to the "H" and the "L" level is controlled by the word line driver 12 and drive of the match line 10 to the "H" and the "L" level and a floating state thereof are controlled by the match line driver 13. In addition, the voltage outputted on the match line 10 during the matching operation is sensed by the match line sense amplifier 14 for determination of match or mismatch.

Now, features of the matching operation, the refreshing operation and the partial writing operation on a word line basis will be described. The operation in each CAM cell is the same as each operation of the corresponding CAM cell which has already described.

MATCHING OPERATION

The above described matching operation is simultaneously carried out in the four CAM cells 11a–11b in the above word. As a result of the matching operation, while the CAM cells indicating "match" or the masked CAM cells do not discharge the match line 10, the CAM cells indicating "mismatch" discharge the match line 10.

Accordingly, if any one of the four CAM cells in the word indicates "mismatch", a match line 10 corresponding to the word is discharged. Therefore, when the potential on the match line is sensed by the match line sense amplifier 14, "mismatch" in the word will be detected.

On the contrary, if all of the unmasked CAM cell among the four CAM cells indicate "match", a potential on a match line 10 corresponding to the word is maintained at the "H" level. When the potential on the match line 10 is sensed by the match line sense amplifier 14, the "match" on the word line is detected.

REFRESHING OPERATION

The above described refreshing operation is simultaneously carried out in the four CAM cells 11a–11d in the word. More specifically, after the match line 10 common to the four CAM cells 11a–11d, the bit lines 6a–6d and the inversion bit lines 7a–7d are discharged to the "L" level, so that the bit lines 6a–6d and the inversion bit lines 7a–7d enter the floating state, the potential on the match line 10 is brought to the "H", level. As a result, the stored data in the CAM cells 11a–11d are read out onto the bit lines 6a–6d and the inversion bit lines 7a–7d. Subsequently, the read out data are amplified. When the potential on the word line 8 common to the four CAM cells is set at the "H" level, the amplified data are written into the respective four CAM cells 11a–11d. After a fixed period of time, setting the potential on the word line 8 to the "L" level completes the refreshing operation on a word line basis.

PARTIAL WRITING OPERATION

A partial writing operation is an operation to write new data into an arbitrarily designated CAM cells among all the CAM cells in the word while the rest of the CAM cells maintain the previously stored data.

Now assuming that the new data are written into only the CAM cells 11a and 11c among the four CAM cells. First, after the match line 10 common to the four CAM cells 11a–11d, the bit lines 6a–6d and the inversion bit lines 7a–7d are discharged to the "L" level, so that the bit lines 6a–6d and the inversion bit lines 7a–7d to enter the floating state of the "L" level, the potential on the match line 10 is set at the "H" level. As a result, the stored data of the respective CAM cells 11a–11d are read out onto the bit lines 6a–6d and the inversion bit lines 7a–7d, and subsequently the read out data are amplified.

Then, the data to be written are applied to the bit lines 6a and 6c, and the inversion bit lines 7a and 7c. In this state, the new data to be written into the CAM cells 11a and 11c are being applied to the bit lines 6a and 6c and the inversion bit lines 7a and 7c, while the data stored in the CAM cells 11b and 11d are amplified to be applied to the bit lines 6b and 6d and the inversion bit lines 7b and 7d. Then, when the potential on the common word line 8 of the four CAM cells is set at the "H" level, the data applied to the bit lines and the inversion bit lines are written into the corresponding cell of the four CAM cells. After a fixed period of time, setting the potential on the word line 8 at the "L" level completes the partial writing operation.

Through the above described operations, the new data are written into the CAM cells 11a and 11c through the word lines and the stored data in the CAM cells 11b and 11d are refreshed.

As shown in FIG. 14, actually in a CAM, a plurality of words are arranged to form an array. In FIG. 14, four words 15A–15D constitute one array. The word 15A comprises four CAM cells 11a–11d, a word line 8, a match line 10, a word line driver 12, a match line driver 13 and a match sense amplifier 14. The words 15B, 15C and 15D are constituted in the same manner.

While the above described matching operation is simultaneously carried out for the whole array, the above described writing, reading, refreshing and partial writing operations are sequentially carried out for each word.

Although in the example of FIG. 14, the array comprises four words, in practice an array is comprised of several tens to several hundreds of words in most of the cases. Accordingly, in order to carry out the above described operations for the whole array, which are performed for each word, each operation should be repeated the same number of times as the number of words, that is, several tens to several hundreds of times. In addition, during the operation, other operation for the array is prohibited. Especially, of the above described operations carried out for each word, the refreshing operation is generally performed in succession on a word basis for the whole array, and the partial writing operation is also performed in succession on a word basis for the whole array for a plurality of words on a in many cases.

Accordingly, with respect to the refreshing operation and the partial writing operation, these operations must be repeated the same number of times as the number of words corresponding to the operations, so that the execution of the operations requires a very long time period, and during the operation, all of the other operations for the array are prohibited.

In addition, power consumption is increased due to many times of the operations.

SUMMARY OF THE INVENTION

An object of the present invention is to shorten an operation time period of a semiconductor memory device.

Another object of the present invention is to drastically shorten a time period required for a refreshing operation and a partial writing operation in a content addressable memory.

A further object of the present invention is to reduce a power consumption in refreshing and partial writing operations in a content addressable memory.

Still another object of the present invention is to provide a method of refreshing and partial writing by which an operational time period and a power consumption can be reduced in a content addressable memory.

The above and other objects of the invention are satisfied by a content addressable memory array comprising CAM cells arranged in words in a plurality of rows and columns, a plurality of word lines corresponding to the plurality of rows and being connected to the cells in corresponding rows, a plurality of match lines corresponding to the plurality of rows and being connected to the cells in corresponding rows, a plurality of complementary bit line pairs corresponding to the plurality of columns and being connected to the cells in corresponding columns, and selecting means for selecting any of a plurality of word lines.

In accordance with one aspect of the invention, all the memory cells of the array may be refreshed simultaneously. This is carried out by applying a signal having a first level to both lines of all the bit line pairs to refresh cells storing a signal having the first level, and then applying to the lines a signal having a second level to refresh cells storing a signal having the second level.

In accordance with another aspect of the invention, a partial writing on an array basis is carried out by applying a signal having a predetermined level to both bit lines of each of bit line pairs containing data to be masked and applying to the bit lines of other bit line pairs data to be written to selected cells containing unmasked data. Array based refresh and partial write operation are made possible by a unique cell structure.

In accordance with a further aspect of the invention, a semiconductor memory device comprises memory cells connected to first and second bit lines and a word line, each memory cell comprising first and second storage nodes for storing information, first and second control nodes, a control device for activating or inactivating the first control node, a potential supply device, a first switching device, and a second switching device.

The control device sets during the writing the first control node in an active or inactive state, sets, during a refreshing the first control node in the active state when the information applied to the first and the second bit lines and the information stored in the first and the second storage nodes match with each other, and sets the first control node in the inactive state when the information applied to the first and the second bit lines and the information stored in the first and the second storage nodes do not match with each other. The potential supply device applies a potential on the word line to the second control node when the first control node is set in the active state. The first switching device is coupled between the first bit line and the first storage node and controlled by a potential of the second control node. The second switching device is coupled between the second bit line and the second storage node and controlled by the potential of the second control node.

In the semiconductor memory device according to the present invention, if the first control node is set in the active state in writing the information, the potential on the word line is applied to the second control node. Therefore, the first and the second switching devices are controlled by the potential on the word line, so that the information is written from the first and the second bit lines into the first and the second storage nodes.

If the first control node is set in the inactive state in writing the information, no potential on the word line is applied to the second control node. Therefore, the first and the second switching devices are not controlled by the potential on the word line, nor is the information written into the first and the second storage nodes.

Accordingly, the information is written into memory cells whose first control node is in the active state and no information is written into memory cells whose first control node is in inactive state. Thus, a single writing operation completes a partial writing.

In the refreshing operation, when the information applied to the first and the second bit lines and the information stored in the first and the second storage nodes match with each other, the first control node is set in the active state. As a result, the potential on the word line is applied to the second control node. Therefore, the first and the second switching devices are controlled in response corresponding to the potential on the word line, and the information applied to the first and the second bit lines are written into the first and the second storage nodes. Thus, the information stored in the first and the second storage nodes are refreshed.

On the other hand, when the information applied to the first and the second bit lines and the information stored in the first and the second storage nodes do not match with each other, the first control node is set in the inactive state. As a result, no potential on the word line is applied to the second control node. Therefore, the first and the second switching devices are not controlled by the potential on the word line, nor is the information written into the first and the second storage nodes.

Accordingly, first, when the same information are applied to all of the first and the second bit lines, only the memory cells storing the same information as those are refreshed. Then, when the inversion information are applied to all of the first and the second bit lines, only the memory cells storing the same information as those are refreshed. In this way, all the memory cells are refreshed by performing the operation twice.

As described above, according to the present invention, in the writing operation, since the information is written only in the memory cells with the first control nodes set in the active state, the partial writing can be completed by a single writing operation.

In addition, in the refreshing operation, since only the memory cells storing the same information as that applied to the first and the second bit lines are refreshed, all the memory cells can be refreshed by performing the operation twice.

Accordingly, it will be possible to drastically reduced a time period and a power consumption required for the partial writing operation and the refreshing operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a waveform for explaining a reading operation of the embodiment.

FIG. 7B is a diagram for explaining an operation of the CAM of FIG. 7A.

FIG. 7C is a diagram for explaining a partial write operation for plural words.

FIG. 7D is a diagram for explaining a masked search operation.

DESCRIPTION OF THE PREFERRED EMBODIMENTS

The embodiments of the present invention will be described in detail with reference to the drawings in the following.

Figure 1:
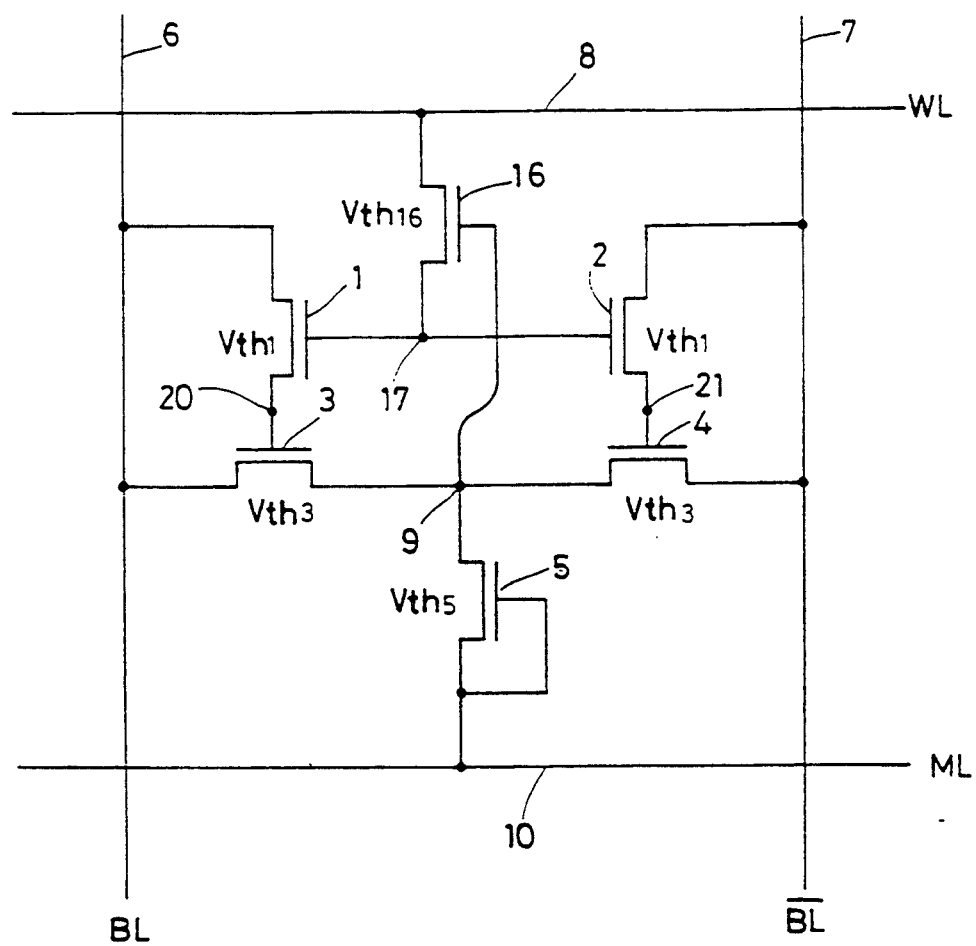
FIG. 1 is a circuit diagram showing a CAM cell in accordance with a first embodiment of the present invention.

Referring to FIG. 1, the CAM cell comprises six N channel MOS transistors 1–5 and 16. The transistor 1 is connected between a bit line 6 and a storage node 20, and the transistor 2 is connected between an inversion bit line 7 and an inversion storage node 21, and a gate of each of the transistors being connected to a second control node 17. The transistor 3 is connected between the bit line 6 and a control node 9, and the transistor 4 is connected between the inversion bit line 7 and the first control node 9. A gate of the transistor 3 is connected to the storage 20 and a gate of the transistor 4 is connected to the storage node 21. The transistor 5 is connected between a match line 10 and the first control node 9, and has a gate connected to the match line 10. The transistor 16 is connected between a word line 8 and the second control node 17, and has a gate connected to the first control node 9.

Now, refreshing, partial writing, writing, matching and reading operations of the CAM cell of FIG. 1 will be described with reference to the waveform diagrams of FIGS. 2 to 6. In the following description, "L" indicates a ground potential Vss, and "H" indicates a power supply potential Vcc. In addition, Vth1 denotes a threshold voltage of the transistors 1 and 2, Vth3 denotes a threshold voltage of the transistors 3 and 4, and Vth5 and Vth16 denote threshold voltages of the transistors 5 and 16, respectively.

REFRESHING OPERATION

Figure 2:
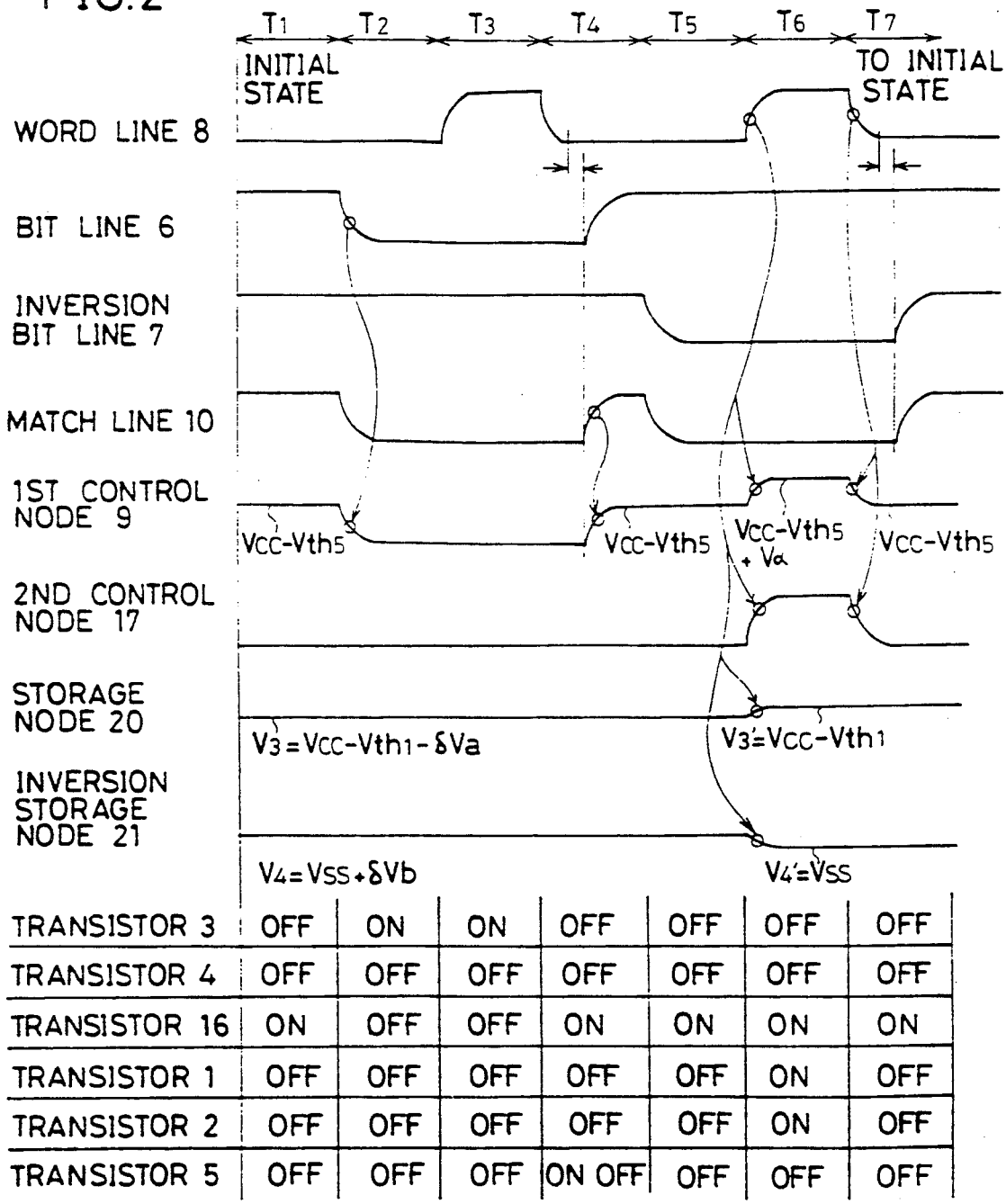
FIG. 2 is a waveform diagram for explaining a refreshing operation of the first embodiment.

Referring to FIG. 2, first it is assumed that data "1" is stored in the CAM cell of FIG. 1. On this occasion, in the CAM cell, a potential of the storage node 20, that is, a potential of a gate of the transistor 3 will be represented as the following equation.

$$V3 = Vcc - Vth1 - \delta Va(t) \quad \ldots (1)$$

In addition, a potential of the inversion storage node 21, that is, a potential of a gate of the transistor 4 will be represented as the following equation.

$$V4 = Vss + \delta Vb(t) \quad \ldots (2)$$

wherein δVa(t) and δVb(t) denote the amount of voltages fluctuated from the writing potential due to the leak of the electric charges. "t" denotes time. Hereinafter, (t) is omitted. When the values of the δVa and δVb are large, the CAM cell malfunctions. It is assumed herein that V3 > Vth + Vss > V4.

In the cycle T1, the CAM cell enters an initial state. More specifically, the word line 8 is driven to the "L" level, and the bit line 6, the inversion bit line 7 and the match line 10 are driven to the "H" level. In this state, both of the transistors 3 and 4 are in the off state. A potential of the first control node 9 is represented s Vcc-Vth5, and the transistor 16 is in the on state. Therefore, the second control node 17 is driven to the "L" level through a potential on the word line 8, so that the potential of the terminal becomes the ground potential Vss, whereby the transistors 1 and 2 enter in the off state.

In the cycle T2, the bit line 6 is driven to the "L" level, the inversion bit line 7 is driven to the "H" level, and the match line 10 is driven to the "L" level. In this state, the transistor 3 is in the on state and the transistor 4 is in the off state. Therefore, the first control node 9 is driven to the "L" level through a potential on the bit line 6, so that the potential of the terminal becomes the ground potential Vss. As a result, the transistor 16 is turned off and a potential of the second control node 17 is maintained at the ground potential Vss.

In the cycle time T3, the word line 8 is driven from the "L" to the "H" level. On this occasion, the first control node 9 is driven to the "L" level through the potential on the bit line 6, so that a gate potential of the transistor 16 is maintained at the ground potential Vss, whereby the transistor 16 remains in the off state. Accordingly, a potential of the second control node 17 is maintained at the ground potential Vss, so that the transistors 1 and 2 are maintained in the off state.

In the above described operations during the cycles T1–T3, since the transistors 1 and 2 are always maintained in the off state, potentials of the storage node 20 and the inversion storage node 21, that is, gate potentials of the transistors 3 and 4 are maintained at the above described potentials V3 and V4, respectively.

In the cycle T4, the CAM cell is set in the same state as the initial state of the cycle T1. Namely, the transistors 1 and 2 are in the off state.

Contrary to the cycle T2, in the cycle T5, the bit line 6 is driven to the "H" level, the inversion bit line 7 is driven to the "L" level and the match line 10 is driven to the "L" level. Even in this state, the transistors 3 and 4 are maintained in the off state. Therefore, the potential of the first control node 9 is maintained at the Vcc-Vth5. Accordingly, the transistor 16 is maintained in the off state and the potential of the second control node 17 is maintained at the ground potential Vss.

In the cycle T6, the word line 8 is driven from the "L" to the "H" level. On this occasion, the first control node 9 is electrically cut off from other nodes by the transistors 3, 4 and 5 to be in enter the floating state. Therefore, the potential of the first control node 9 is raised by Vα to be Vcc-Vth5+Vα due to a coupling capacitance between the gate of the transistor 16 and the word line 8. The value Vα is determined by a capacitance division based on the whole capacitance related to the first control node 9 and the coupling capacitance. Vα herein will be represented as the following equation.

$$V\alpha = (Vcc - Vss) \times Cgs/C9 \quad \ldots (3)$$

wherein Cgs denotes a coupling capacitance and C9 denotes a whole capacitance related to the first control node 9.

On this occasion, if Vα-Vth5 is larger than Vth16, Vcc-Vth5+Vα will be larger than Vcc+Vth16, which causes the potential of the first control node 9 to be boosted to Vcc+Vth16 or above. Accordingly, the transistor 16 is maintained in the on state and the potential of the second control node 17 is raised to the power supply potential Vcc which is the same as the potential on the word line 8. As a result, the transistors 1 and 2 are turned on and potentials of the storage node 20 and the inversion storage node 21 become V3' and V4' which will be represented as the following equations respectively.

$$V3' = Vcc - Vth1 \quad \ldots (4)$$

$$V4' = Vss \quad \ldots (5)$$

In the cycle T7, the CAM cell is set in the same state as the initial state of the cycle T1. As a result, the transistors 1 and 2 enter the off state. Accordingly, the gate potentials of the transistors 3 and 4 are maintained at the above described V3' and V4', respectively.

By performing a series of operations of the above described cycles T1-T7, the potential of the storage node 20 changes from V3 (refer to the equation (1)) to V3' (referred to the equation (4)) and the potential of the inversion storage node 21 changes from V4 (refer to the equation (2)) to V4' (refer to the equation (5)). Namely, the amount of voltage fluctuations $\alpha Va$ and $\alpha Vb$ due to a leak current and the like become 0, refreshing the storage node in the CAM cell.

As is clear from the above described series of operations, with respect to the operation for driving from the external to the CAM cell the bit line 6, the inversion bit line 7, the word line 8 and the match line 10, those the operations of the cycles T1-T3 and those of the cycles T4-T6 are completely the same except that the data "0" is applied to the bit line pair in the cycle T2 and the data "1" is applied to the bit line pair in the cycle T5. On the other hand, with respect to the operation in the CAM cell, no refreshing operation is carried out in the CAM cell as a result of the operations in the cycles T1-T3 and a refreshing operation is performed as a result of the operations in the cycles T4-T6. More specifically, when the stored data in the CAM cell does not match the data in the corresponding bit line pair, the stored data is not refreshed, and when the stored data in the CAM cell matches the data in the corresponding bit line pair, the stored data is refreshed.

Accordingly, in case the stored data in the CAM cell is "0", if a series of operations of the cycles T1-T7 are performed, the stored data in the CAM cell matches the data in the corresponding bit line pair during the operations of the cycles T1-T3, so that the CAM cell is refreshed. In addition, the stored data in the CAM cell does not match the data in the corresponding bit line pair during the operations of the cycles T4-T6, so that the CAM cell maintains the data refreshed during the cycles T1-T3.

As is clear from the above described results, since all the CAM cells in the array store the data of "1" or "0", a collective refreshing operation for all the CAM cells in the array is completed by repeating only once a series of operations in the above described cycles T1-T4.

While in the prior art, the number of cycles required for a refreshing operation for one word is 3, in the present embodiment the number of cycles required for a refreshing operation for one array is 7. Accordingly, for example if one array is comprised of 100 words, while 300 cycles are required for a refreshing operation for one array in the prior art, only 7 cycles are required in the present embodiment. Namely, the application of the present invention enables a drastic reduction of a time period and a power consumption required for a refreshing operation.

It is possible to refresh only a word including a desired CAM cell by performing the above described operations of the cycles T1-T7 with respect to only a word including a CAM cell to be refreshed in a single array and continuously driving a word line 8 and a match line 10 corresponding to the rest of the words to the "L" level. This is effective t reduce the number of CAM cells to be simultaneously and collectively refreshed in the array in order to, for example, reduce a leak current.

PARTIAL WRITING OPERATION

First, an operation of a CAM cell to be written will be described with reference to FIG. 3.

Description will be given of an example in which first "1" is stored as the data in the CAM cell of FIG. 1 and then the stored data in the CAM cell is rewritten into the "0". On this occasion, in the CAM cell, the potential of the storage node 20 will be represented as $V3' = Vcc - Vth1$ and the potential of the inversion storage node 21 will be represented as $V4' = Vss$.

In the cycle T1, the CAM cell is set in an initial state. As a result, the transistors 1 and 2 are in the off state.

In the cycle T2, with the bit line 6 and the inversion bit line 7 being driven to the "H" level, the match line 10 is driven to the "L" level. In this state, the transistor 5 is turned off and a potential of the first control node is maintained in a floating state at $Vcc - Vth5$. Accordingly, the transistor 16 is maintained in the on state and the potential of the second control node 17 is maintained at the ground potential Vss.

In the cycle T3, the word line 8 is driven from the "L" to the "H" level. On this occasion, the first control node 9 is electrically cut off from other nodes through the transistors 3, 4 and 5 to be in the floating state. Therefore, the potential of the first control node 9 is raised by $V\alpha$ to be represented as $Vcc-Vth5+V\alpha$ due to a coupling capacitance between the gate of the transistor 16 and the word line 8, wherein the value $V\alpha$ is determined by the above described equation (3).

On this occasion, if $V\alpha\text{-}Vth5 > Vth16$, the potential of the first control node 9 will be represented as $Vcc\text{-}Vth5+V\alpha > Vcc+Vth16$ and is boosted to $Vcc+Vth16$ or above. As a result, the transistor 16 is maintained in the on state and the potential of the second control node 17 is driven to the power supply potential Vcc which is the same as the potential on the word line 8. Accordingly, the transistors 1 and 2 are turned on. Since both of the bit line 6 and the inversion bit line 7 are driven to the "H" level, the electric changes are stored in the gate capacitance of the transistor 4, so that the gate potential of the transistor 4 will be represented as $V4' = Vcc - Vth1$. Namely, the potentials of the storage node 20 and the inversion storage node 21 will be represented as $V3' = V4'' = Vcc - Vth1$.

In the cycle T4, the data "0" is applied to the bit line pair 6 and 7. More specifically, the bit line 6 is driven to the "L" level and the inversion bit line 7 is driven to the "H" level. On this occasion, the electric charges stored in the gate capacitance of the transistor 3 are drawn out by the bit line 6 through the transistor 1, so that the gate potential of the transistor 3 will be represented as $V3'' = Vss$.

On the other hand, none of the electric charges stored in the gate capacitance of the transistor 4 moves, so that the gate potential thereof is maintained at $V4'' = Vcc - Vth1$. In addition, since the transistor 1 is in the on state, an MOS diode connection is formed between the bit line 6 and the first control node 9 through the transistor 3. As a result, the transistor 3 is in the off state, and therefore the potential of the first control node 9 is maintained at Vcc - Vth5 + Vα.

In the cycle T5, the CAM cell is set in the same state as the initial state of the cycle T1, thereby turning off the transistors 1 and 2. As a result, the gate potentials of the transistors 3 and 4 are maintained at the above described V3" and V4", respectively.

The stored data in the CAM cell is rewritten from "1" to "0" through the operations in the cycles T1-T5. More specifically, the potential of the storage node 20 changes from V3'=Vcc - Vth1 to V3"=Vss, and the potential of the inversion storage node 21 changes from V4'=Vss to V4"=Vcc - Vth1.

With respect to a series of operations in the CAM cell in the cycles T1-T5, while the stored data in the CM cell is erased during the operations of the cycles T1-T3, the data is written into the CAM cell during the operations of the cycles T4-T5. Accordingly, even if the stored data in the CAM cell is "0", they can be erased, as the above described example, through the operations of the cycles T1-T3. In the same manner as the above described example. In case of the writing of the data "1" into the CAM cell, the data "1" is applied to a bit line pair corresponding to the CAM cell during the operations of the cycles T4 and T5.

Now, an operation of a CAM cell to which no writing is performed (maintaining the stored data) will be described with reference to FIG. 4. For example, assuming that the data "1" is stored in the CAM cell of FIG. 1. On this occasion, in the CAM cell, the potential of the storage node 20 will be represented as V3'=Vcc - Vth1 and the potential of the inversion storage node 21 will be represented as V4'=Vss.

In the cycle T1, the CAM cell is set in the initial state, thereby turning off the transistors 1 and 2.

In the cycle T2, the bit line 6, the inversion bit line 7 and the match line 10 are driven to the "L" level. In this state, the transistor 3 is turned on and the potential of the first control node 9 becomes the ground potential Vss through the potential on the bit line 6. Accordingly, the transistor 16 is turned off and the potential of the second control node 17 is maintained at the ground potential Vss.

In the cycle T3, the word line is driven from the "L" to the "H" level. On this occasion, since the first control node 9 is driven to the "L" level through the potential on the bit line 6, the gate potential of the transistor 16 is maintained at the ground potential Vss. The transistor 16 is maintained in the off state, and therefore the potential of the second control node 17 is maintained at Vss. As a result, the transistors 1 and 2 are maintained in the off state.

In the cycle T4, the state of the cycle T3 is maintained.

In the cycle T5, the CAM cell is set in the same state as the initial state of the cycle T1, whereby the transistors 1 and 2 are maintained in the off state. Accordingly, the gate potentials of the transistors 3 and 4 are maintained at the above described V3' and V4', respectively.

Even through the operations of the cycles T1-T5, the storage data "1" in the CAM cell is maintained. More specifically, the potential of the storage node 20 is maintained at V3'=Vcc - Vth1 and the potential of the inversion storage node 20 is maintained at V4'=Vss.

As is clear from the foregoing description, even when the CAM cell stores the data "0", the CAM cell maintains the data "0" as a result of the above described operations the cycles T1-T5. Namely, in all the CAM cells to which the operations of the cycle T1-T5 are performed, each storage data in the CAM cells is maintained.

Figure 13:
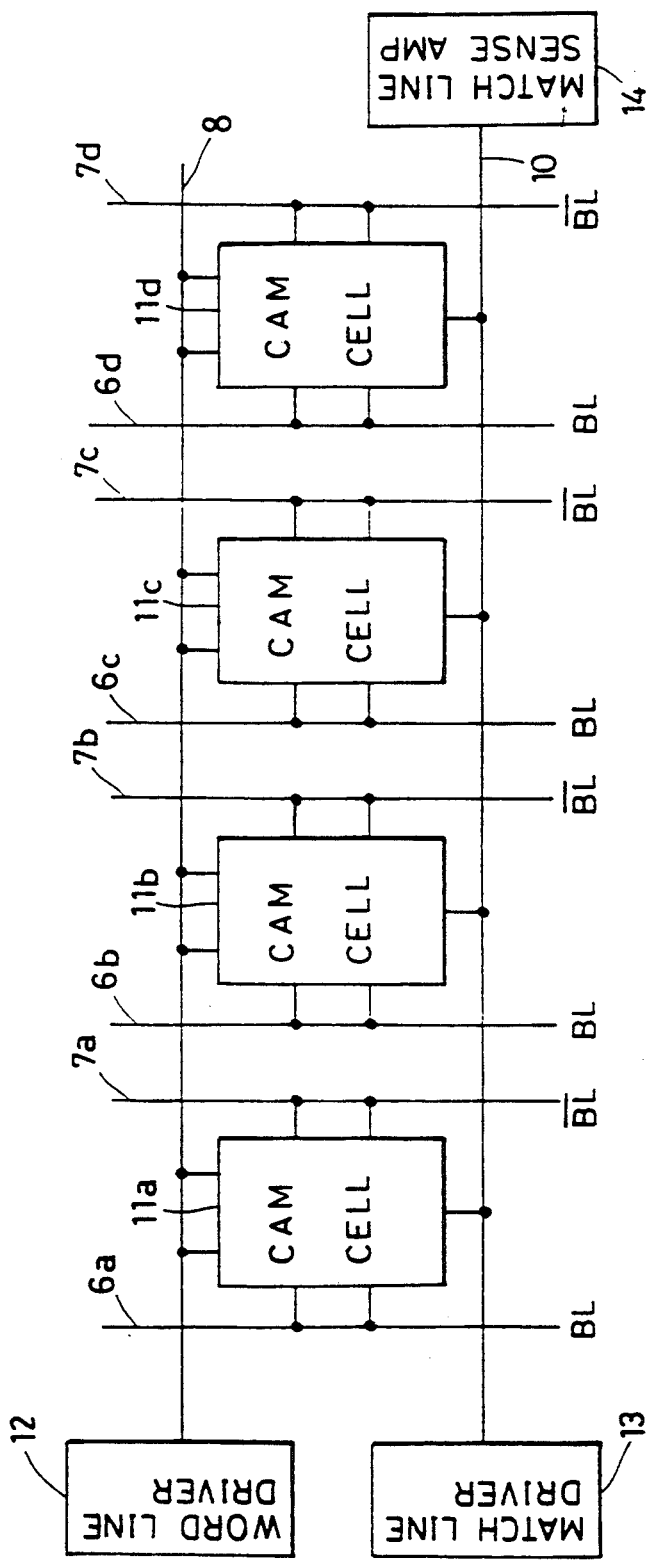
FIG. 13 is a diagram showing a word comprised of four CAM cells.
Figure 14:
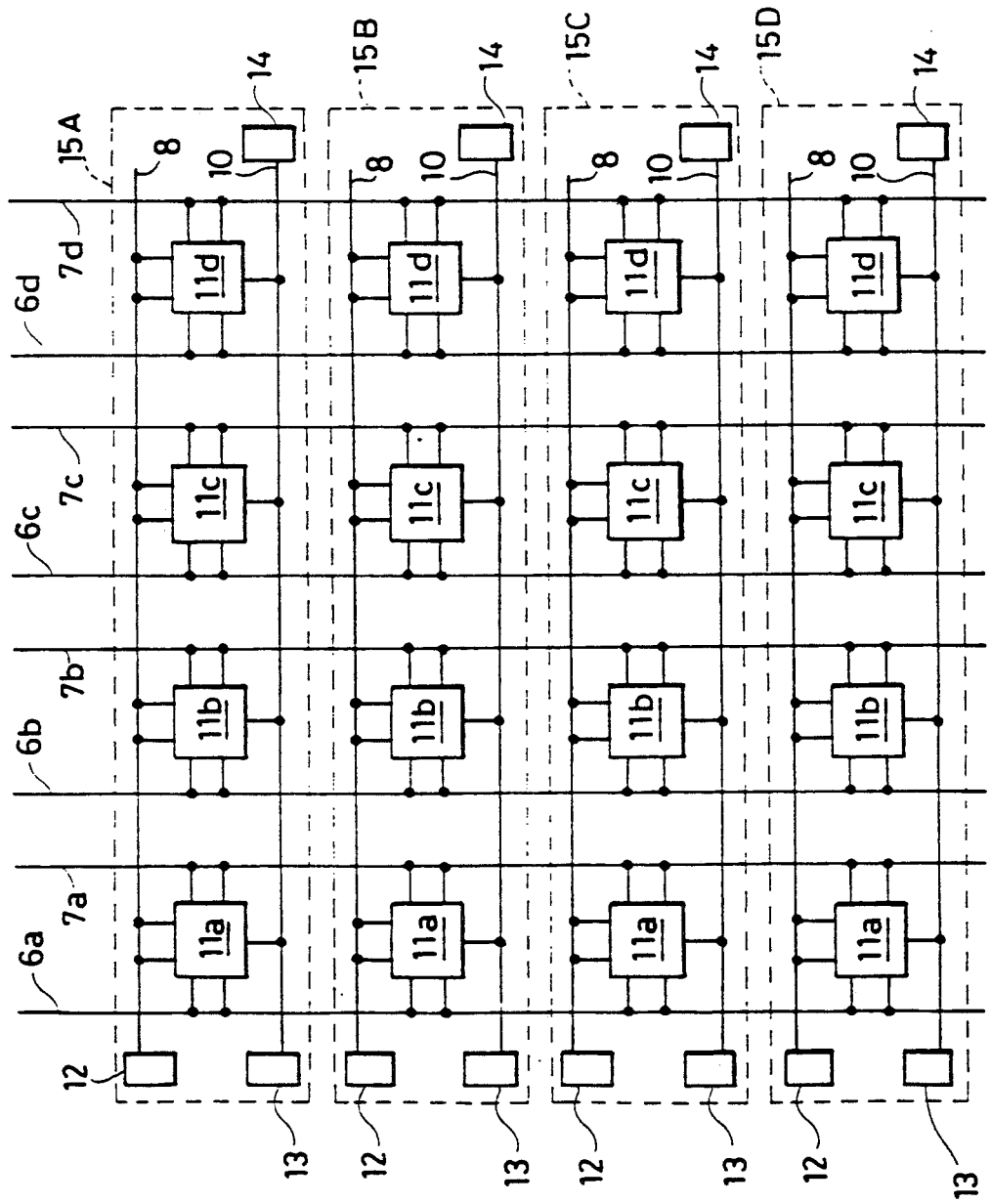
FIG. 14 is a diagram showing an array comprised of four words.

As is already described, a plurality of CAM cells constitute a word as shown in FIG. 13. A series of operations in the cycles T1-T5 shown in FIG. 3 and a series of operations in the cycles T1-T5 shown in FIG. 4 are simultaneously performed in parallel in each word. Comparing each operation of FIG. 3 and each operation of FIG. 4 which correspond to each other, for example, comparing the cycle T1 of FIG. 3 and the cycle T1 of FIG. 4, the cycle T2 of FIG. 3 and the cycle T2 of FIG. 4 and the like, the operations of the word line 8 and the match line 10 are the same although the bit line 6 and the inversion bit line 7 are different from each other in operation.

Figure 3:
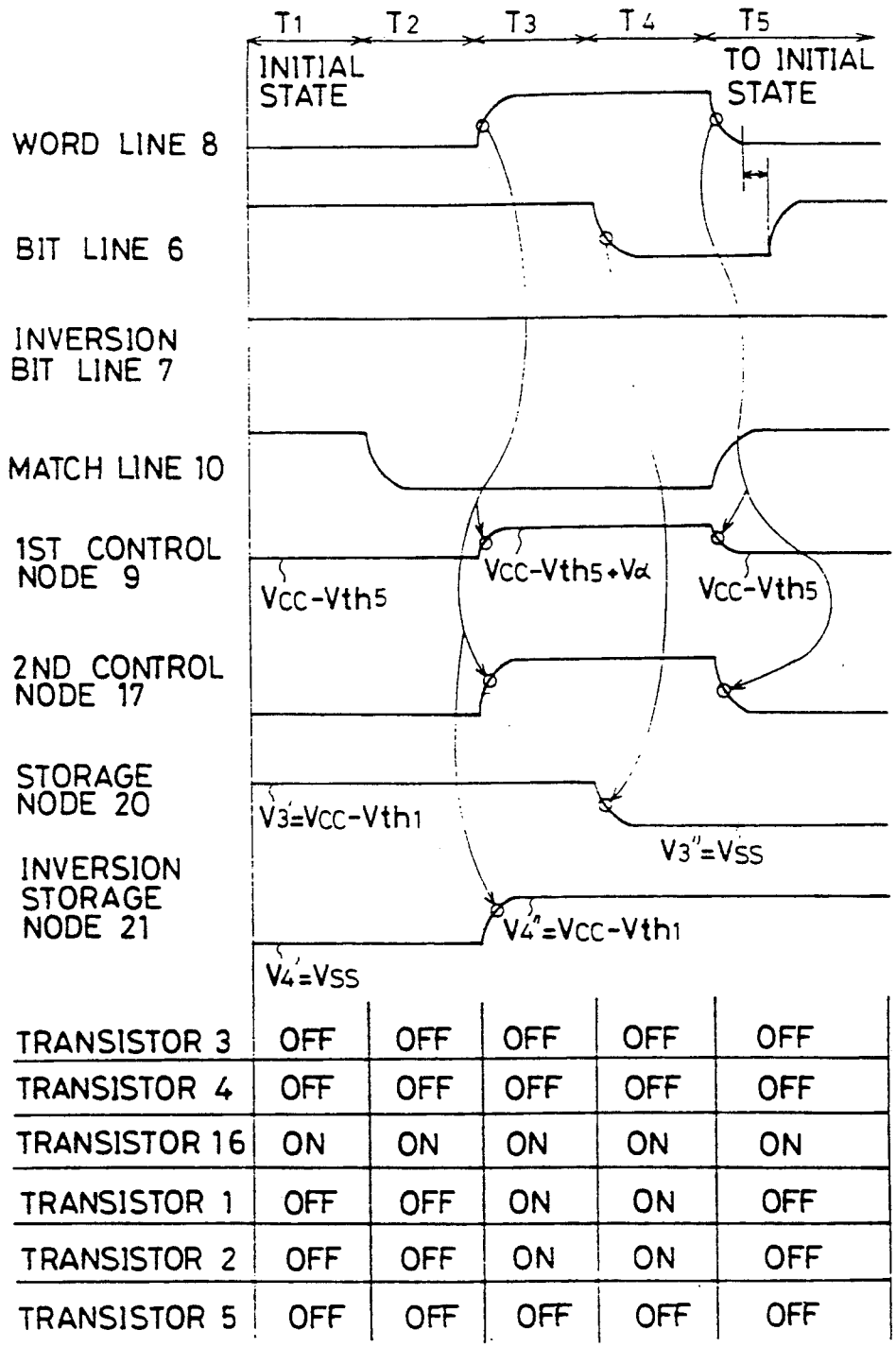
FIG. 3 is a waveform diagram for explaining an operation of a writing bit in writing and partial writing operation according to the embodiment.
Figure 4:
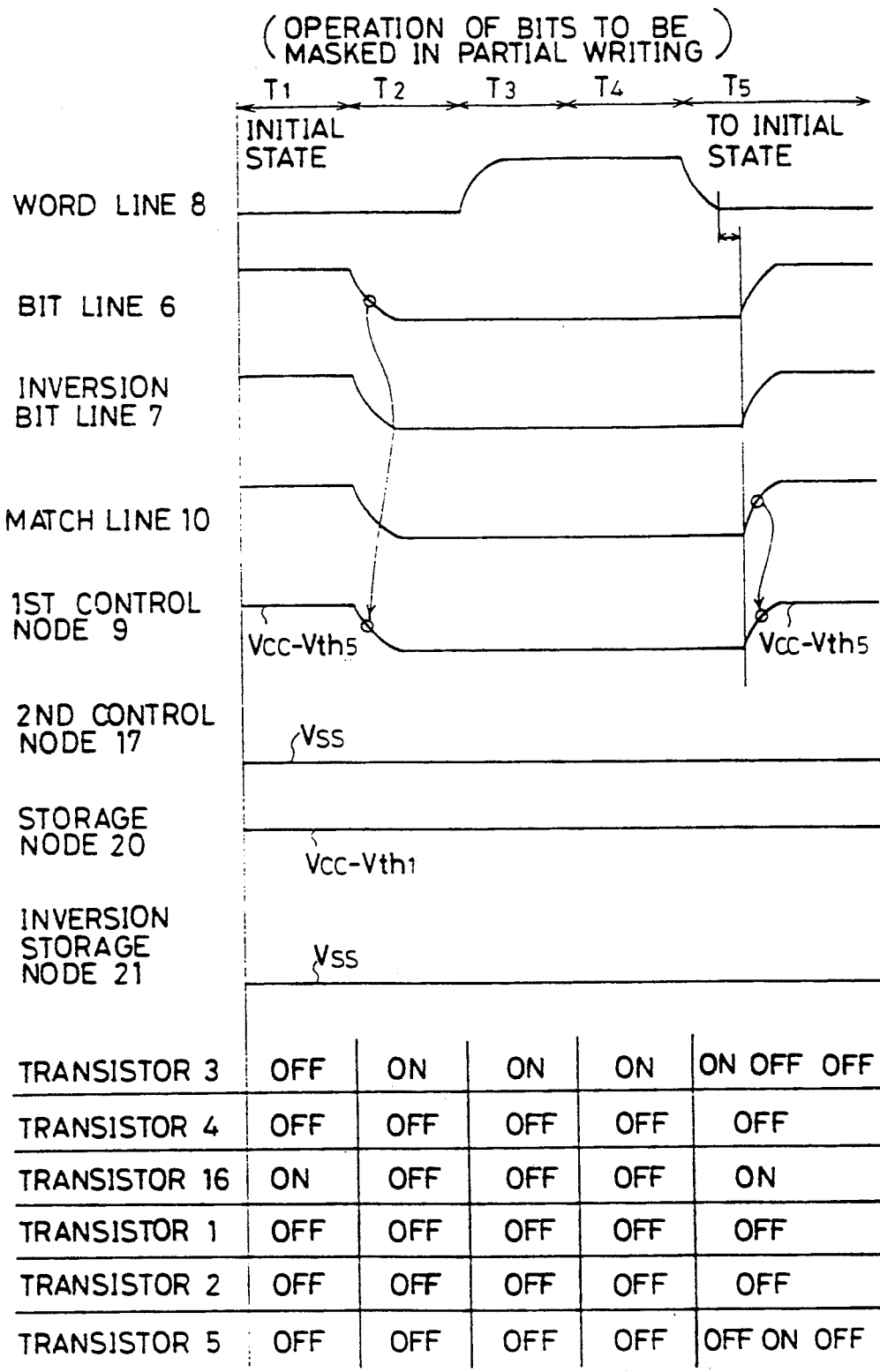
FIG. 4 is a waveform diagram for explaining an operation of a mask bit in the partial writing according to the embodiment.

Accordingly, in the word, the operations of the cycles T1-T5 of FIG. 3 are carried out to the bit line pairs corresponding to the CAM cells whose data is to be rewritten, and at the same time, the operations of the cycles T1-T5 of FIG. 4 are carried out to the bit line pairs corresponding to the CAM cell whose stored data is to be maintained. In this manner, a partial writing operation is performed.

When the above described operations of the cycles T1-T5 of FIG. 3 and of the cycles T1-T5 of FIG. 4 are carried out once to all the words in the array, the data applied to a bit line pair to be written in the array is written to all the CAM cells connected to the bit line pair and with respect to all the rest of the CAM cells connected to the bit line pairs which are not to be written, the stored data thereof are maintained. Namely, a partial writing operation is completed, over the whole array.

While in the prior art, the number of cycles required for a partial writing operation for one word is 3, in the present embodiment, the number thereof required for one array is 5. For example, in case of an array comprising 100 words, while in the prior art 300 cycles are required for one array for a partial writing operation, only 5 cycles are required in this embodiment. Accordingly, by applying the present invention, time period and a power consumption required for the partial writing operation can be drastically reduced.

Figure 5:
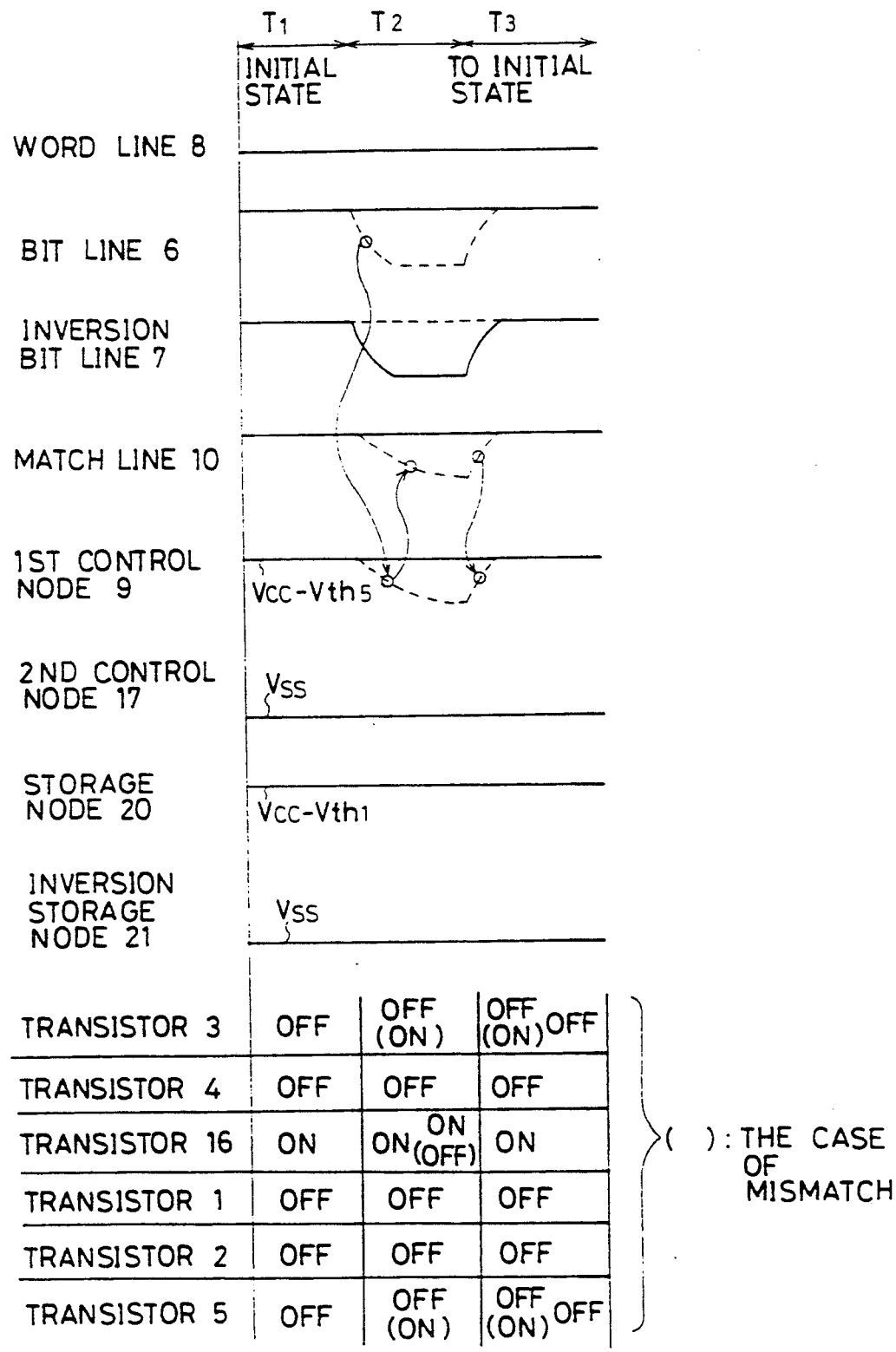
FIG. 5 is a waveform for explaining a matching operation of the embodiment.

It becomes possible to perform a partial writing operation only for a desired plurality of words or a single word by carrying out a series of operations of the cycles T1-T5 of FIG. 3 and the cycles T1-T5 of FIG. 5 only for the words to be partially written in one array, and by continuously driving to the "L" level the word lines 8 and the match lines 10 corresponding to other words.

WRITING OPERATION

The writing operation is the same as that performed with respect to the CAM cells to be partially written, that is, it is the same as the operations of the cycles T1-T5 of FIG. 5 in the foregoing description of the partial writing operation.

MATCHING OPERATION

Referring to FIG. 5, the matching operation of the present embodiment is almost the same as that of the prior art. Now, for example, assuming, for example, that the stored data is "1".

First, in the cycle T1, the CAM cells are set in an initial state, whereby the match line 10 is precharged to the "H" level to be in the floating cell. In the cycle T2, the retrieval data is applied to the bit line pair 6 and 7.

In case the stored data and the retrieval data do not match with each other, the match line 10 is discharged to the "L" level. On the other hand, in case the stored data and the retrieval data match with each other, the match line 10 is not discharged to be maintained at the "H" level. In FIG. 5, the solid line shows a case in which the data of "1" is applied to the bit line pair 6 and 7, and the broken line shows a case in which the data of "0" is applied thereto.

READING OPERATION

Referring to FIG. 6, the reading operation is almost the same as that of the prior art. It is assumed herein that the stored data is "1".

First, in the cycle T1, the CAM cells are set in the initial state. In the cycle T2, the match line 10, the bit line 6 and the inversion bit line 7 are discharged to the "L" level and further more, the bit line 6 and the inversion bit line 7 are caused to enter the floating state. As a result, the potential of the first control node 9 falls to the "L" level. In the cycle T3, the potential on the match line 10 is brought to the "H" level, whereby the potential of the first control node 9 is raised to Vcc-Vth5. As a result, the potential on the bit line 6 rises to Vcc- Vth5 - Vth3. Thus, the stored data "1" is read out.

As the foregoing, according to the CAM cells of the above described embodiment, the refreshing operation and the partial writing operation can be simultaneously and collectively performed for an entire array or a plurality of word. In addition, the matching operation, the reading operation and the writing operation can be performed in almost the same manner as that of the prior art.

Figure 7A:
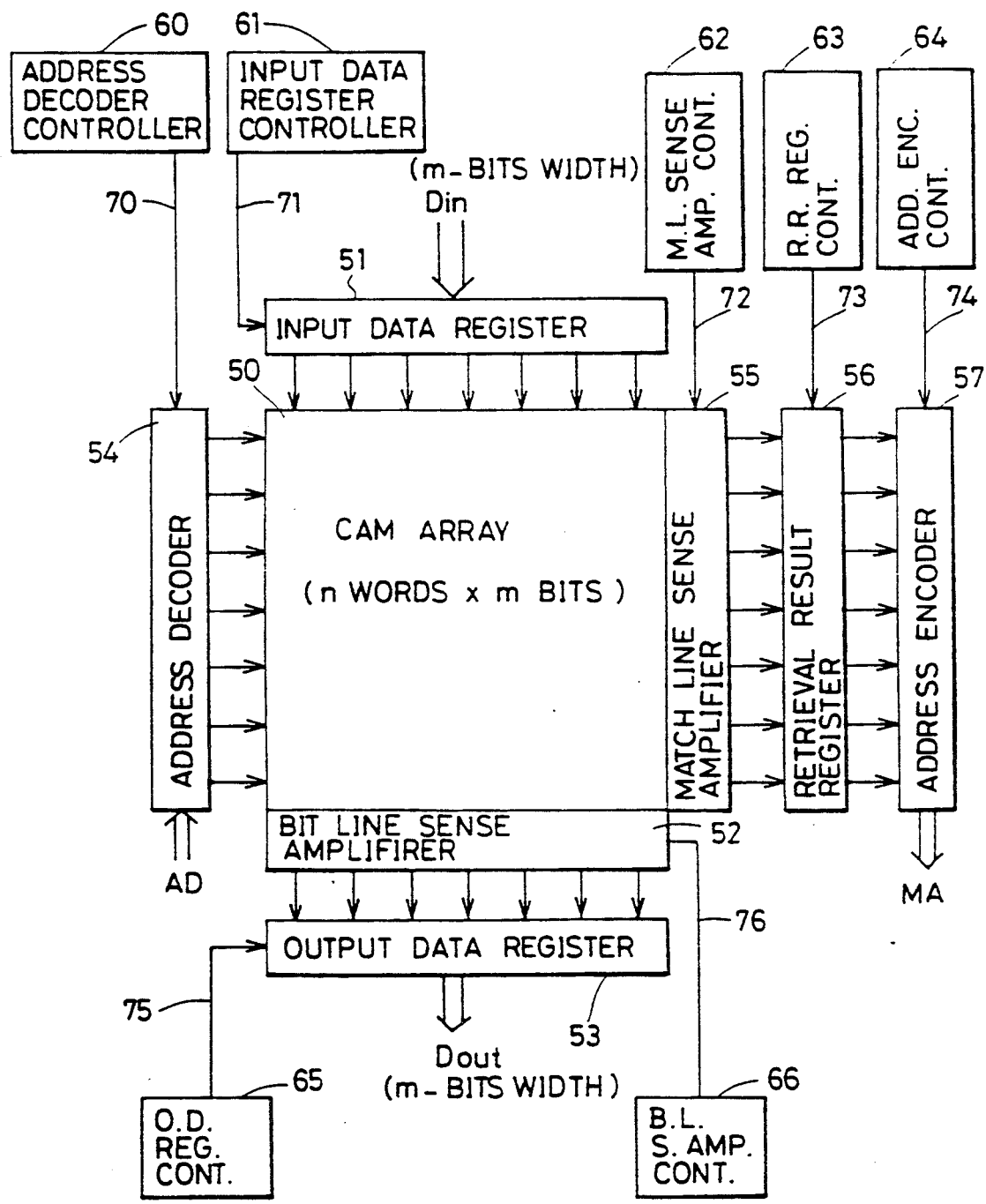
FIG. 7A is a block diagram showing an entire structure of a CAM using the CAM cell of the embodiment.

Referring to FIG. 7A, the CAM comprises a CAM array 50, an input data register 51, a bit line sense amplifier 52, an output data register 53, and an address decoder 54, a match line sense amplifier 55, a retrieval result register 56 and an address encoder 57. The CAM array 50 comprises a plurality of CAM cells arranged in matrix of n words and m bits.

In a reading operation, an address decoder controller 60, an output data register controller 65 and a bit line sense amplifier controller 66 activate control lines 70, 75 and 76, respectively, as shown in FIG. 7B, so that the address decoder 54, the output data register 53 and the bit line sense amplifier 52 are operated. In a writing operation, the address decoder controller 60 and an input data register controller 61 activate the control lines 70 and 71, respectively, so that the address decoder 54 and the input data register 51 are operated.

In a search operation (a matching operation), the input data register controller 61, a match line sense amplifier controller 62, a retrieval result register controller 63 and an address encoder controller 64 activate the control lines 71, 72, 73 and 74, respectively, so that the input data register 51, the match line sense amplifier 55, the retrieval result register 5b and the address encoder 57 are operated. In an array based refresh operation, the address decoder controller 60, the input data register controller 61 and the bit line sense amplifier controller 66 activate the control lines 70, 71 and 76, respectively, so that the address decoder 54, the input data register 51 and the bit line sense amplifier 52 are operated. In a partial writing operation for plural words, the address decoder controller 60 and the input data register controller 61 activate the control lines 70 and 71, respectively, so that the address decoder 54 and the input data register 51 are operated.

Now, an operation of the CAM will be described.

WRITING OPERATION OF DATA TO THE CAM ARRAY

First, m bit writing data Din is inputted to the input data register 51. The writing data applied to the input data register is applied to all the bit line pairs of the CAM array 50. Then, an address signal AD ($\log_2 n$ bit width) is inputted to the address decoder 54. The address decoder 54 decodes the address signal AD, thereby selecting a word. A word line corresponding to the word attains the "H" level and the writing data of each bit line pair is written into a corresponding CAM cell. Finally, the word line is again driven to the "L" level.

READING OPERATION OF DATA FROM THE CAM ARRAY

The address signal AD is inputted to the address decoder 54. The address decoder 54 decodes the address signal AD, thereby selecting a word. Match lines corresponding to the word are driven to the "H" level and the data in each CAM cell included in the word is read out onto a corresponding bit line pair. The data read out onto the bit line pair is amplified by the bit line sense amplifier 52 and written into the output data register 53. The data written in the output data register 53 is outputted as the reading data Dout.

MATCHING OPERATION FOR THE CAM ARRAY

First, m bit retrieval data is inputted to the input data register 51. The data applied to the input data register 51 is applied to all the bit line pairs in the CAM array 50. In n words in the CAM array 50, the stored data in each word and the retrieval data applied to a bit line pair are compared, and a result of the comparison is outputted onto a match line. The detection result outputted from the match line of each word is amplified by the match line sense amplifier 55. The retrieval result amplified by the match line sense amplifier 55 is written into a corresponding word in the retrieval result register 56. On this occasion, a register corresponding to the word is set wherein the stored data and the retrieval data match with each other. Receiving the result from the retrieval result register 56, the address encoder 57 outputs, as a retrieval result address MA, an address corresponding to the word wherein the stored data and the retrieval data match with each other.

In the partial write operation for plural words, as shown in FIG. 7C, data to be written are set to the input data register 51. "X" denotes a masked bit. The address decoder 54 selects words. For the selected words, the data of the bit-positions corresponding to "1" of the written data are changed into "1", the data of the bit-positions corresponding to "0" of the written data are changed into "0", and the data of the bit-positions corresponding to "X" of the written data remain the previous data. For the unselected words, the data of all the bit-positions remain the previous data.

In the masked operation, as shown in FIG. 7D, retrieval data are set to the input data register 51. "X" denotes a masked bit. The bit-positions corresponding to "X" of the retrieval data does not participate in the search (bit-checking) operation.

Figure 8:
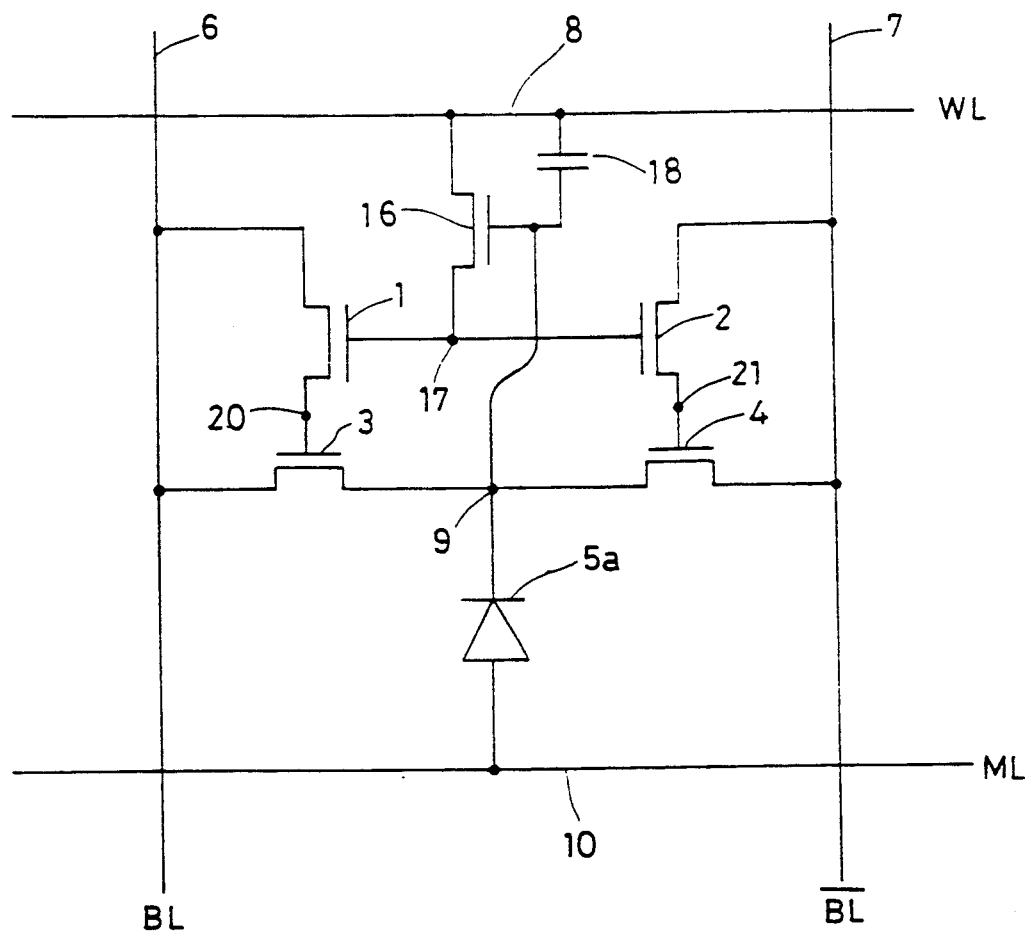
FIG. 8 is a circuit diagram showing a CAM cell according to a second embodiment of the present invention.

Referring to FIG. 8, in this embodiment, a PN junction diode 5a is used in place of the transistor 5 of FIG.

1. In addition, a capacitance element 18 having a capacitance value Cw is added.

The operation of the CAM cell according to the embodiment of FIG. 8 is the same as that of the CAM cells of FIG. 1 except for the following two points. First, in the embodiment of FIG. 1, the diode is comprised of the N channel MOS transistor 5, so that when the match line 10 is driven to the "H" level, the first control node 9 is charged up to Vcc-Vth5. In the embodiment of FIG. 8, the diode is comprised of the PN junction diode 5a, so that when the match line 10 is driven to the "H" level, the first control node 9 is charged almost to Vcc-Vbi5. Vbi5 herein is a built-in voltage of the PN junction diode 5a.

Secondly, while in the embodiment of FIG. 1, the coupling capacitance between the first control node 9 and the word line 8 comprises only the coupling capacitance Cgs between the gate and the source of the transistor 16, in the embodiment of FIG. 8, it further comprises the capacitance value Cw of the capacitance element 18, in addition to the coupling capacitance Cgs.

Accordingly, when the first control node 9 is in the floating state and the potential on the word line 8 rises by Vcc-Vss, in the embodiment of FIG. 1, the potential of the first control node 9 is raised by $V\alpha$ which is determined by the above described equation (3) through a capacitance coupling. In the embodiment of FIG. 8, the potential of the first control node 9 is raised by $V\beta$ represented by the following equation.

$$V\beta = (Vcc - Vss) \times (Cgs + Cw) / (C9 + Cw) \quad \ldots (6)$$

As is clear from the equations (3) and (6), $V\alpha$ is smaller than $V\beta$.

Accordingly, in the embodiment of FIG. 8, the operation of the cycle T6 in FIG. 2 and the operation of the cycle T3 in FIG. 3 can be more reliably performed.

More specifically, as a result of the operations of the cycle of T6 of FIG. 2 and the cycle T3 of FIG. 3, in order that a potential of the storage node 20 or a potential of the inversion storage node 21 reaches Vcc-Vth1, a potential of the second control node 17 should be driven up to Vcc. In addition, for this purpose, the potential of the first control node 9 should be boosted to (Vcc - Vth16) or more. Accordingly, in the embodiment of FIG. 1, Vcc - Vth5 + $V\alpha$ should be larger than Vcc+Vth6, that is, $V\alpha$- Vth5 should be larger than Vth16. In the embodiment of FIG. 8, (Vcc - Vbi5 + $V\beta$) > (Vcc + Vth16), that is, ($V\beta$- Vbi5) > Vth16.

As described above, since $V\alpha$ is smaller than $V\beta$ and in general Vth5 is larger than Vbi5, the refreshing operation and the partial writing operation in the present invention can be more easily and reliably performed according to the embodiment of FIG. 8.

Figure 9:
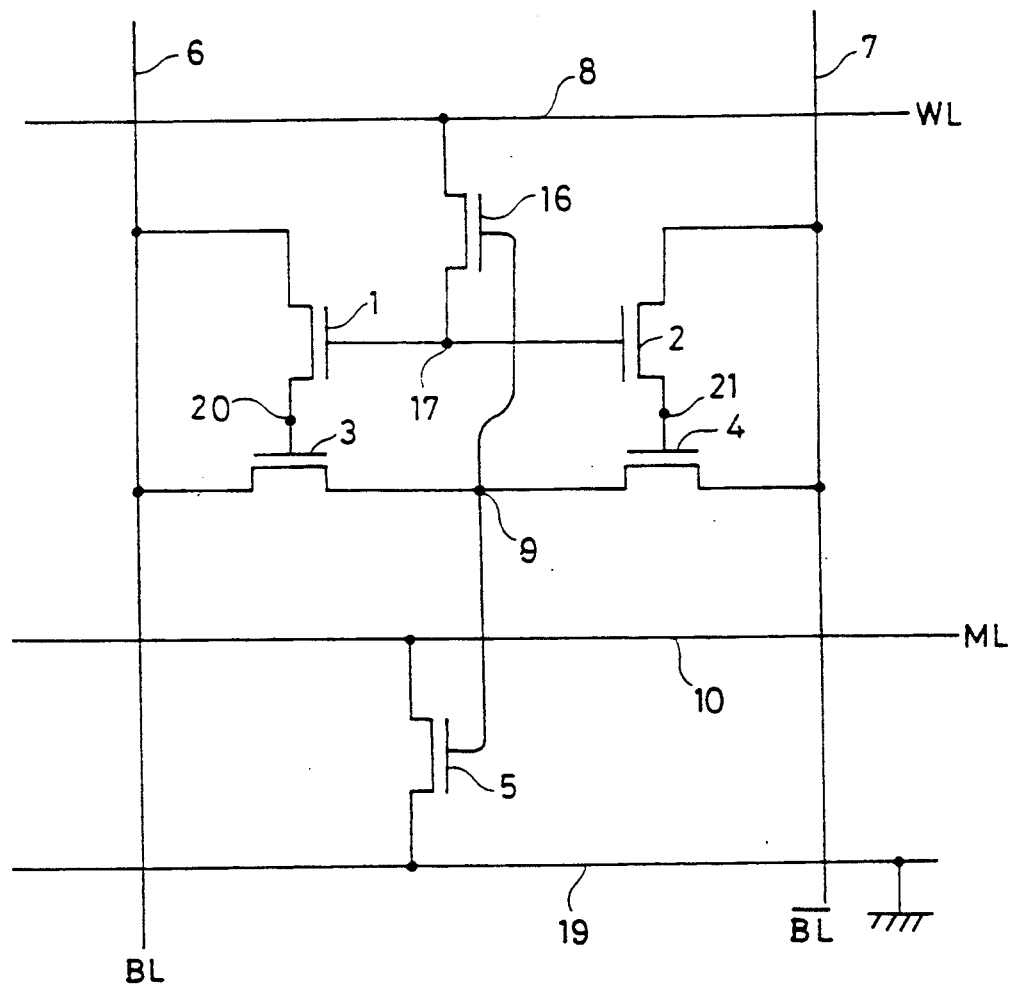
FIG. 9 is a circuit diagram showing a CAM cell according to a third embodiment of the present invention.

Referring to FIG. 9, a transistor 5 is connected between a match line 10 and a ground line 19 and has a gate connected to a first control node 9. Operations in the CAM cell of FIG. 9 are almost the same as those of the CAM cell of FIG. 1 except for the matching operation and the reading operation. In the stand-by state, the match line 10 is brought to the "L" level.

In the reading operation, the bit line pair 6 and 7 are precharged to the "H" level to enter the floating state and the potential on the word line 8 is raised from the "L" to the "H" level.

In addition, in the matching operation, the potentials on the bit line 6 and the inversion bit line 7 are brought to the "L" level and the match line 10 is precharged to the "H" level as the initial state. Subsequently, in case the data "1" is applied to the bit line pair 6 and 7, the bit line 6 is driven to the "L" level and the inversion bit line 7 is driven to the "H" level. In case the data "0" is applied to the bit line pair 6 and 7, the bit line 6 is driven to the "H" level and the inversion bit line 7 is driven to the "L" level. In addition, in case the CAM cell is masked, both of the bit line 6 and the inversion bit line 7 are driven to the "L" level. At this time, if the match line 10 remains at the "H" level, the word indicates "match", and if the match line 10 is discharged to the "L" level, the word line indicates "mismatch".

Figure 10:
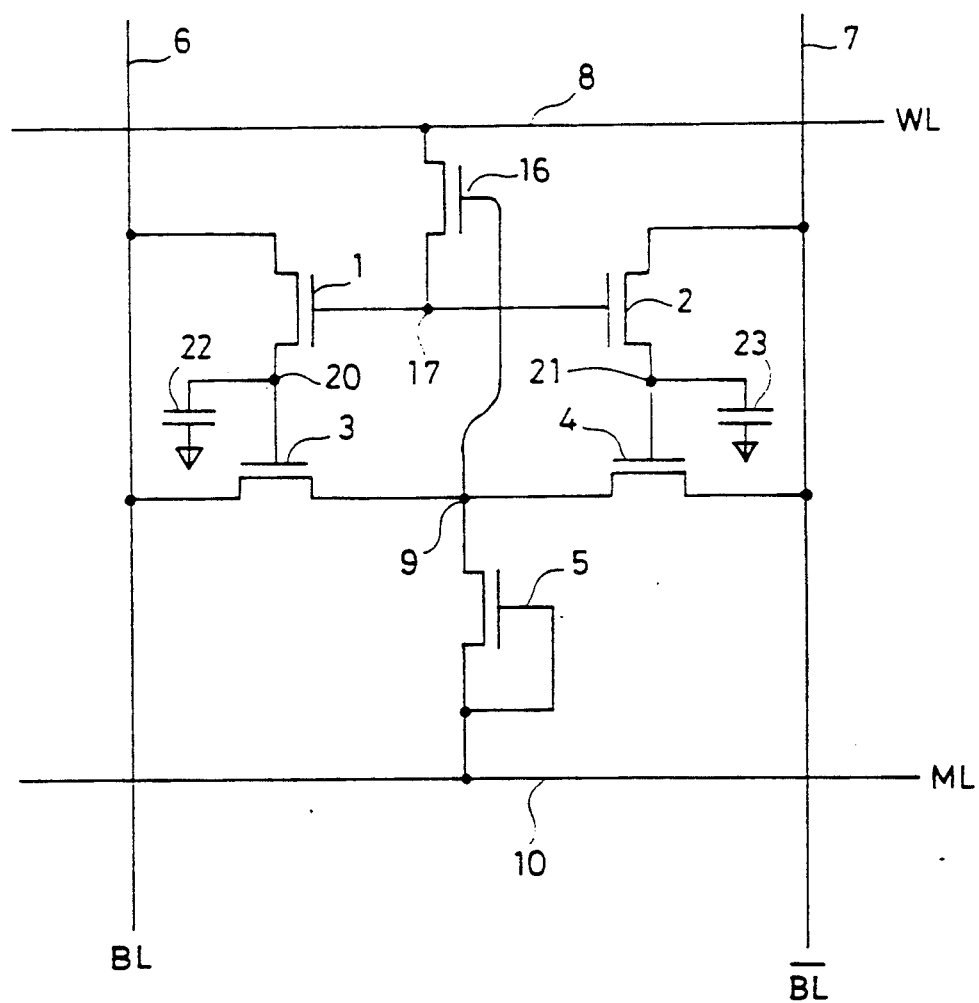
FIG. 10 is a circuit diagram showing a CAM cell according to a fourth embodiment of the present invention.
Figure 11:
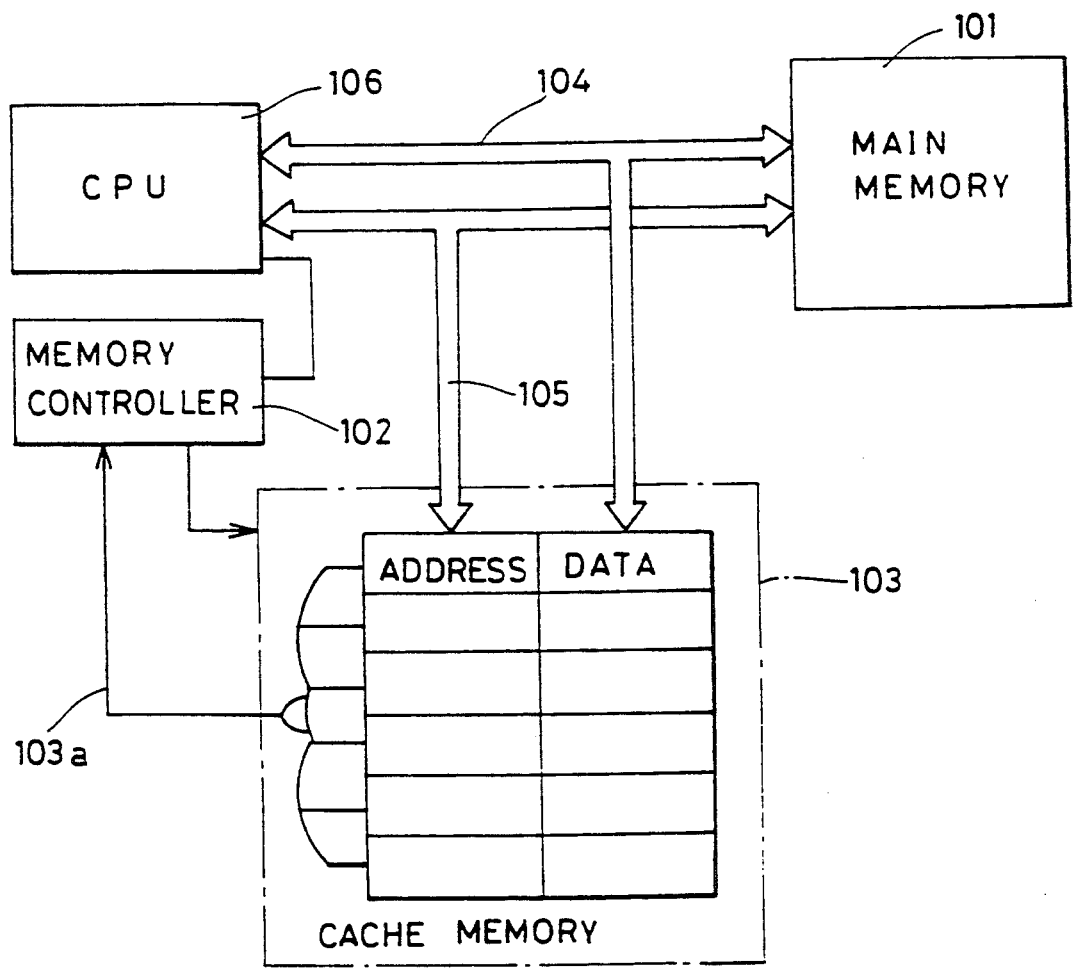
FIG. 11 is a block diagram showing a structure of a cache system using the CAM.
Figure 12:
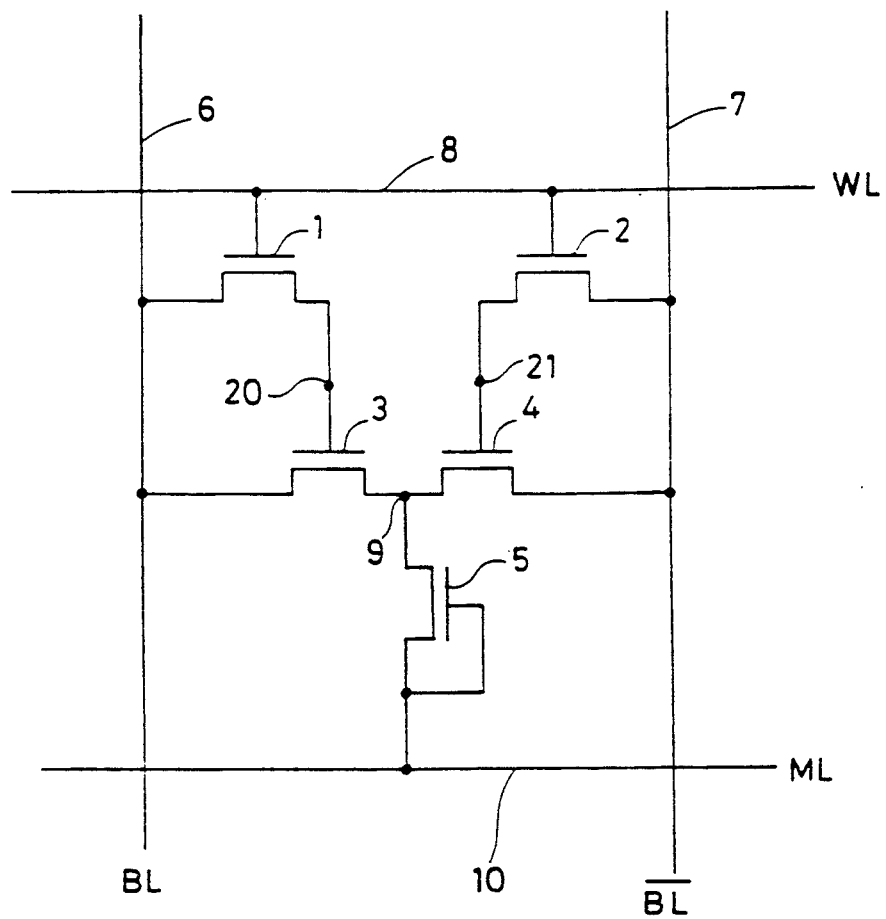
FIG. 12 is a circuit diagram showing a conventional CAM cell.

Referring to FIG. 10, a capacitance element 22 is connected to a storage node 20 and a capacitance element 23 is connected to an inversion storage node 21. The rest of the structure is the same as that of the embodiment of FIG. 1.

The capacitance elements 22 and 23 are added such that the CAM cells maintain the stored data more stably. The operation of the CAM cells of FIG. 10 is the same as that of the CAM cells of FIG. 1.

The above first to fourth embodiments can be suitably combined. In addition, while all of the switch elements of the above described first to fourth embodiments are comprised of the N channel MOS transistors, a CAM cell having the same function can be structured by the P channel MOS transistors. Furthermore, the switch elements can be partly replaced by bipolar transistors or other elements having the same functions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including at least one memory cell connected to first and second bit lines and a word line, said memory cell comprising:
   first and second storage nodes for storing information,
   first and second control nodes,
   controlling means for rendering said first control node active or inactive,
   potential supplying means for applying a potential on said word line to said second control node when said first control node is active,
   first switching means coupled between said first bit line and said first storage node and controlled by a potential of said second control node, and
   second switching means coupled between said second bit line and said second storage node and controlled by the potential of said second control node,
   said controlling means including means for (1) setting said first control node in an active or inactive state at the time of writing, (2) setting said first control node in the active state when at the time of refreshing, the information applied to said first and second bit lines match the information stored in said first and second storage nodes, and (3) setting said first control node in the inactive state when the information applied to said first and second bit lines do not match the information stored in said first and second storage nodes.

2. A semiconductor memory device according to claim 1, wherein
   said controlling means comprises:

third switching means coupled between said first bit line and said first control node and controlled by a potential of said first storage node, and fourth switching means connected between said second bit line and said first control node and controlled by a potential of said second storage node, said potential supplying means comprises:

fifth switching means coupled between said word line and said second control node and controlled by a potential of said first control node.

3. A semiconductor memory device according to claim 2, further comprising a match line, wherein said memory cell is further connected to said match line, and said memory cell further comprises comparison result outputting means responsive to the potential of said first control node for controlling a potential on said match line.

4. A semiconductor memory device according to claim 2, wherein each of said first, second, third, fourth and fifth switching means is comprised of MOS transistors.

5. A semiconductor memory device according to claim 1, further comprising:

first capacitance means coupled between said first storage node and a predetermined potential, and second capacitance means coupled between said second storage node and the predetermined potential.

6. A semiconductor memory device according to claim 3, wherein said comparison result outputting means comprises an MOS transistor diode-connected between said first control node and said match line.

7. A semiconductor memory device according to claim 3, wherein said comparison result outputting means comprises a PN junction diode connected between said first control node and said match line.

8. A semiconductor memory device according to claim 3, wherein said comparison result outputting means comprises an MOS transistor coupled between said match line and a predetermined potential and controlled by the potential of said first control node.

9. A semiconductor memory device according to claim 2, wherein said potential supplying means further comprises capacitance means connected between said word line and said first control node.

10. A content addressable memory cell connected to a bit line, an inversion bit line, a word line and a match line, comprising:

first and second storage nodes for storing information, first and second control nodes, a first switch element connected between said bit line and said first storage node and controlled by a potential of said second control node, a second switch element connected between said inversion bit line and said second storage node and controlled by the potential of said second control node, a third switch element connected between said bit line and said first control node and controlled by a potential of said first storage node, a fourth switch element connected between said inversion bit line and said first control node and controlled by a potential of said second storage node, a fifth switch element connected between said word line and said second control node and controlled by a potential of said first control node, and comparison result outputting means responsive to the potential of said first control node for controlling a potential of said match line, said fifth switch element capacitive-coupling said word line and said first control node, whereby the potential of said first control node fluctuates due to said capacitive coupling when the potential on said word line fluctuates with said first control node being electrically non-conductive with all of said bit line, said inversion bit line and said match line.

11. A content addressable memory cell according to claim 10, wherein each of said first, second, third, fourth and fifth switch elements is comprised of MOS transistors.

12. A semiconductor memory device comprising:

a plurality of memory cells arranged in a plurality of rows and columns, a plurality of word lines provided corresponding to said plurality of rows, and connected to memory cells in the corresponding rows, a plurality of match lines provided corresponding to said plurality of rows, and connected to the memory cells in the corresponding rows, a plurality of bit lines provided corresponding to said plurality of columns, and connected to memory cells in the corresponding columns, a plurality of inversion bit lines provided corresponding to said plurality of columns, and connected to the memory cells in the corresponding columns, selecting means for selecting any of said plurality of word lines, data inputting means for applying the data applied from the external to said plurality of bit lines and inversion bit lines, data outputting means for reading the data on said plurality of bit lines and inversion bit lines to the external, and retrieval result outputting means for outputting a retrieval result appearing on said plurality of match lines to the external, each of said plurality of memory cells comprising, first and second storage nodes for storing information, first and second control nodes, a first switch element connected between said bit line and said first storage node and controlled by a potential of said second control node, a second switch element connected between said inversion bit line and said second storage node and controlled by the potential of said second control node, a third switch element connected between said bit line and said first control node and controlled by a potential of said first storage node, a fourth switch element connected between said inversion bit line and said first control node and controlled by a potential of said second storage node, a fifth switch element connected between said word line and said second control node and controlled by a potential of said first control node, and comparison result outputting means responsive to the potential of said first control node for controlling a potential of said match line, said fifth switch element capacitive-coupling said word line and said first control node, whereby the potential of said first control node fluctuates due to said capacitive coupling when the potential on said word line fluctuates with said first control node being electrically non-conductive with all of said bit line, said inversion bit line and said match line.

13. A method of refreshing a semiconductor memory device comprising a plurality of memory cells connected to a plurality of first and second bit lines and a plurality of word lines, each memory cell including, first and second storage nodes, first and second control nodes, potential supplying means for supplying a potential on a word line to said second control node when said first control node are active, first switching means coupled between said a first bit line and said first storage node and controlled by a potential of said second control node, and second switching means coupled between said second bit line and said second storage node and controlled by the potential of the second control node, comprising the steps of:

applying information to said plurality of first and second bit lines, and setting said first control node in the active state in memory cells wherein the information applied to said plurality of first and second bit lines and the information stored in said first and second storage nodes match with each other, and setting said first control node in the inactive state in memories cell wherein the information applied to said plurality of first and second bit lines and the information stored in said first and second storage nodes do not match with each other.

14. A method of a partial writing of a semiconductor memory device comprising a plurality of memory cells connected to a plurality of first and second bit lines and a plurality of word lines, each memory cell comprising first and second storage nodes, first and second control nodes, potential supplying means for applying a potential on a word line to said second control node when said first control node are active, first switching means coupled between said first bit line and said first storage node and controlled by a potential of said second control node, and second switching means coupled between said second bit line and said second storage node and controlled by the potential of said second control node, comprising the steps of:

setting said first control node in the active state in memory cells to which a writing operation is performed and setting said first control node in the inactive state in the memory cell to which no writing operation is performed, and applying desired information to said plurality of first and second bit lines.

15. A content addressable semiconductor memory comprising, an array of CAM cells arranged in a plurality of rows and columns, a plurality of word lines corresponding to said plurality of rows and being connected to the cells in corresponding rows, a plurality of match lines corresponding to said plurality of rows and being connected to the cells in corresponding rows, a plurality of complementary bit line pairs corresponding to said plurality of columns and being connected to said cells in corresponding columns, selecting means for selecting any of said plurality of word lines, data inputting means for applying external data to said plurality of bit line pairs, data outputting means for reading data on said plurality of bit line pairs to the outside, and retrieval result outputting means for outputting a retrieval result appearing on said plurality of match lines, and means for refreshing simultaneously all said memory cells of said array.

16. The content addressable semiconductor memory of claim 15, wherein each of said plurality of bit line pairs comprises a bit line and an inversion bit line, each of said plurality of memory cells comprises, first and second storage nodes for storing information, first and second control nodes, a first switch element connected between said bit line and said first storage node and controlled by a potential of said second control node, a second switch element connected between said inversion bit line and said second storage node and controlled by the potential of said second control node, a third switch element connected between said bit line and said first control node and controlled by a potential of said first storage node, a fourth switch element connected between said inversion bit line and said first control node and controlled by a potential of said second storage node, a fifth switch element connected between said word line and said second control node and controlled by a potential of said first control node, and comparison result outputting means responsive to the potential of said first control node for controlling a potential of said match line, said fifth switch element capacitive-coupling said word line and said first control node, whereby the potential of said first control node fluctuates due to said capacitive coupling when the potential on said word line fluctuates with said first control node being electrically non-conductive with all of said bit line, said inversion bit line and said match line.

17. The content addressable semiconductor memory of claim 16, wherein said refreshing means includes means for applying a signal having a first level to both lines of all said bit line pairs to refresh cells storing a signal having the first level, and means for applying a signal having a second level to both lines of all said bit line pairs to refresh cells storing a signal having the second level.

18. A content addressable semiconductor memory comprising, an array of CAM cells arranged in a plurality of rows and columns, a plurality of word lines corresponding to said plurality of rows and being connected to the cells in corresponding rows, a plurality of match lines corresponding to said plurality of rows and being connected to the cells in corresponding rows, a plurality of complementary bit line pairs corresponding to said plurality of columns and being connected to said cells in corresponding columns, selecting means for selecting any of said plurality of word lines, data inputting means for applying external data to said plurality of bit line pairs, data outputting means for reading data on said plurality of bit line pairs to the outside, and retrieval result outputting means for outputting a retrieval result appearing on said plurality of match lines, and means for partially writing on an array basis.

19. The content addressable semiconductor memory of claim 18, wherein each of said plurality of bit line pairs comprises a bit line and an inversion bit line, each of said plurality of memory cells comprising, first and second storage nodes for storing information, first and second control nodes, a first switch element connected between said bit line and said first storage node and controlled by a potential of said second control node, a second switch element connected between said inversion bit line and said second storage node and controlled by the potential of said second control node, a third switch element connected between said bit line and said first control node and controlled by a potential of said first storage node, a fourth switch element connected between said inversion bit line and said first control node and controlled by a potential of said second storage node, a fifth switch element connected between said word line and said second control node and controlled by a potential of said first control node, and comparison result outputting means responsive to the potential of said first control node for controlling a potential of said match line, said fifth switch element capacitive-coupling said word line and said first control node, whereby the potential of said first control node fluctuates due to said capacitive coupling when the potential on said word line fluctuates with said first control node being electrically non-conductive with all of said bit line, said inversion bit line and said match line.

20. The content addressable semiconductor memory of claim 18 wherein said partial writing means includes means for applying a signal having a predetermined level to both bit lines of each bit line pairs containing data to be masked and means for applying to the bit lines of other bit line pairs data to be written to selected cells containing unmasked data.

* * * * *